US010359170B2

(12) United States Patent
Akisada et al.

(10) Patent No.: US 10,359,170 B2
(45) Date of Patent: Jul. 23, 2019

(54) LAMP FITTING FOR VEHICLE AND COUPLER/DISTIBUTOR

(71) Applicant: Stanley Electric Co., Ltd., Tokyo (JP)

(72) Inventors: Kenji Akisada, Tokyo (JP); Naoko Matsumoto, Tokyo (JP)

(73) Assignee: STANLEY ELECTRIC CO, LTD., Tokyo (JP)

( * ) Notice: Subject to any disclaimer, the term of this patent is extended or adjusted under 35 U.S.C. 154(b) by 200 days.

(21) Appl. No.: 15/128,017

(22) PCT Filed: Mar. 10, 2015

(86) PCT No.: PCT/JP2015/057039
§ 371 (c)(1),
(2) Date: Sep. 21, 2016

(87) PCT Pub. No.: WO2015/146578
PCT Pub. Date: Oct. 1, 2015

(65) Prior Publication Data
US 2017/0097134 A1  Apr. 6, 2017

(30) Foreign Application Priority Data

Mar. 25, 2014  (JP) ................. 2014-061026

(51) Int. Cl.
F21S 41/24      (2018.01)
F21S 43/235     (2018.01)
(Continued)

(52) U.S. Cl.
CPC .......... *F21S 43/235* (2018.01); *B60Q 1/0011* (2013.01); *B60Q 11/002* (2013.01);
(Continued)

(58) Field of Classification Search
CPC . B60Q 1/0011; F21V 2200/10; F21S 48/2237
See application file for complete search history.

(56) References Cited

U.S. PATENT DOCUMENTS 5,126,923 A * 6/1992 Hall, II ............... B60Q 1/2611
                                              362/282
5,147,128 A * 9/1992 Windross ............. G02B 6/0008
                                              362/556
(Continued)

FOREIGN PATENT DOCUMENTS

DE    102005011760 A1    9/2006
DE    102008063634 A1    6/2010
(Continued)

OTHER PUBLICATIONS

Japanese Office Action for the related Japanese Patent Application No. 2014-061026 dated Oct. 30, 2017.
(Continued)

Primary Examiner — Tina M Wong
(74) Attorney, Agent, or Firm — Kenealy Vaidya LLP

(57) ABSTRACT

The lamp fitting for a vehicle includes a plurality of laser light sources, and laser light from the plurality of laser light sources is introduced into a plurality of optical systems, and is used in the plurality of optical systems. The lamp fitting for a vehicle includes: a plurality of laser light sources; one or more optical fibers; one or more optical systems which are provided in conformity with the one or more optical fibers and to which a corresponding emission end of the optical fiber among the one or more optical fibers is connected; and a plurality of optical elements which are disposed between the laser light sources and an incident end of the one or more optical fibers, and constitute an optical path guiding laser light from at least one of the laser light sources to the incident end of the one or more optical fibers.

20 Claims, 23 Drawing Sheets

(51) Int. Cl.
| | |
|---|---|
| *F21S 43/13* | (2018.01) |
| *F21S 41/14* | (2018.01) |
| *F21S 45/47* | (2018.01) |
| *B60Q 1/00* | (2006.01) |
| *B60Q 11/00* | (2006.01) |
| *F21S 43/30* | (2018.01) |
| *F21S 43/20* | (2018.01) |
| *H01S 5/00* | (2006.01) |
| *F21S 41/16* | (2018.01) |
| *F21S 41/365* | (2018.01) |
| *F21Y 115/30* | (2016.01) |

(52) U.S. Cl.
CPC .............. *F21S 41/14* (2018.01); *F21S 41/16* (2018.01); *F21S 41/24* (2018.01); *F21S 41/365* (2018.01); *F21S 43/13* (2018.01); *F21S 43/26* (2018.01); *F21S 43/30* (2018.01); *F21S 45/47* (2018.01); *H01S 5/005* (2013.01); *F21Y 2115/30* (2016.08)

(56) References Cited

U.S. PATENT DOCUMENTS

| | | | | |
|---|---|---|---|---|
| 5,222,793 | A * | 6/1993 | Davenport | F21S 41/24 362/554 |
| 5,422,792 | A * | 6/1995 | Neumann | B60Q 1/0011 362/554 |
| 8,165,433 | B2 * | 4/2012 | Jenkins | G02B 6/3596 385/125 |
| 2008/0165815 | A1 | 7/2008 | Kamijima | |
| 2009/0003390 | A1 * | 1/2009 | Hoving | H04N 9/3129 372/4 |
| 2009/0046474 | A1 * | 2/2009 | Sato | B60Q 1/076 362/466 |
| 2010/0315605 | A1 * | 12/2010 | Arita | G02B 26/0816 353/98 |
| 2011/0148328 | A1 * | 6/2011 | Joseph | F21K 9/00 315/312 |
| 2012/0039072 | A1 | 2/2012 | Lell et al. | |
| 2012/0250129 | A1 * | 10/2012 | Nakatani | G02B 26/0841 359/200.6 |
| 2013/0258689 | A1 | 10/2013 | Takahira et al. | |
| 2014/0168940 | A1 | 6/2014 | Shiomi et al. | |
| 2014/0254188 | A1 * | 9/2014 | Masuda | B60Q 1/0023 362/521 |
| 2016/0169471 | A1 * | 6/2016 | Saito | B60Q 1/0023 362/464 |
| 2017/0097134 | A1 * | 4/2017 | Akisada | F21S 43/13 |

FOREIGN PATENT DOCUMENTS

| | | |
|---|---|---|
| EP | 0595338 A2 | 5/1994 |
| JP | 2008-193054 | 8/2008 |
| JP | 2012-43698 A | 3/2012 |
| JP | 2013-16277 A | 1/2013 |
| JP | 2014-17094 A | 1/2014 |
| JP | 2014-17097 A | 1/2014 |

OTHER PUBLICATIONS

International Search Report and Written Opinion of the International Search Report for PCT/JP2015/057039 dated Jun. 9, 2015.
The Partial Supplementary European Search Report for the related European Patent Application No. 15769949.7 dated Dec. 1, 2017.
International Preliminary Report on Patentability for PCT Patent App. No. PCT/JP2015/057039 (dated Sep. 27, 2016) with English language translation thereof.

* cited by examiner

LAMP FITTING FOR VEHICLE AND COUPLER/DISTIBUTOR

TECHNICAL FIELD

The present invention relates to a lamp fitting for a vehicle, and a coupler/distributor, and particularly relates to a lamp fitting for a vehicle and a coupler/distributor that each include a plurality of laser light sources.

BACKGROUND ART

Conventionally, a lamp fitting for a vehicle that includes a plurality of laser light sources has been proposed (e.g., see PTL 1).

FIG. 23 is a schematic configuration diagram of a lamp fitting 1 for a vehicle described in PTL 1.

As shown in FIG. 23, a lamp fitting 301 for a vehicle described in PTL 1 includes a plurality of laser light sources 302, a plurality of condenser lenses 311 and a plurality of optical fibers 312 that are provided in conformity with the respective laser light sources 302, a lens 313, a reflecting mirror 314, and a light emitter 304 (wavelength converting member) and the like, and adopts, as a light source, a light emitter 304 (wavelength converting member) that is excited and emits light with laser light from the plurality of laser light sources 302, the laser light being condensed by each condenser lens 311, introduced from an incident end (incident end face) of each optical fiber 312, emitted from each emission end (emission end face), condensed by the lens 313, and reflected by the reflecting mirror 314.

CITATION LIST

Patent Literature

{PTL 1}: Japanese Patent Application Laid-Open No. 2013-016277

SUMMARY OF INVENTION

Technical Problem

However, the lamp fitting 301 for a vehicle described in PTL 1 has a configuration where the emission ends of the plurality of optical fibers 312 are connected to a single optical system (e.g., an optical system for a passing beam), and guides laser light from the plurality of laser light sources 302 into the single optical system. There is thus a problem in that the laser light from the plurality of laser light sources 302 cannot be guided into another optical system (e.g., an optical system for a driving beam), and cannot be used in the other optical system.

The lamp fitting 301 for a vehicle described in PTL 1 has a configuration where the plurality of laser light sources 302 simultaneously and continuously light up, thereby causing a problem in that the heat generation increases, and cooling thereof becomes difficult (as a result, the lives of the laser light sources decrease).

The present invention has been made in view of such situations, and first, has an object to introduce laser light from a plurality of laser light sources into a plurality of optical systems and use the light in the plurality of optical systems in a lamp fitting for a vehicle that includes a plurality of laser light sources. Second, the present invention has an object to improve the heat radiation characteristics of the plurality of laser light sources (resultantly improve the lives of laser light sources) in the lamp fitting including the plurality of laser light sources. Third, the present invention has an object to provide a coupler/distributor that can guide laser light from a plurality of laser light sources into a plurality of optical systems, and use the light in the plurality of optical systems. Fourth, the present invention has an object to provide a coupler/distributor that can improve the heat radiation characteristics of the plurality of laser light sources (resultantly improve the lives of laser light sources).

Solution to Problem

To achieve the above object, a first aspect of the present invention is a lamp fitting for a vehicle, including: a plurality of laser light sources; one or more optical fibers; one or more optical systems which are provided in conformity with the one or more optical fibers and to which a corresponding emission end of the optical fiber among the one or more optical fibers is connected; and a plurality of optical elements which are disposed between the plurality of laser light sources and an incident end of the one or more optical fibers, and constitute an optical path guiding laser light from at least one of the plurality of laser light sources to the incident end of the one or more optical fibers.

According to the lamp fitting for a vehicle of the first aspect of the present invention, in the lamp fitting for a vehicle that includes the plurality of laser light sources, the laser light from the plurality of laser light sources can be introduced into the plurality of optical systems, and used in the plurality of optical systems.

This is because the plurality of optical elements that constitute an optical path guiding the laser light from at least one of the plurality of laser light sources to the incident end of the one or more optical fibers are disposed between the plurality of laser light sources and the incident end of the one or more optical fibers.

Furthermore, according to the lamp fitting for a vehicle of the first aspect of the present invention, the laser light from the plurality of laser light sources can be guided to the plurality of optical systems. Consequently, no difference in lives of the laser light sources due to the frequencies in use of the respective optical systems occurs, and the lives of the laser light sources can be increased.

The lamp fitting for a vehicle according to a second aspect of present invention is the lamp fitting for a vehicle according to the first aspect, wherein the optical elements include at least one of a beam splitter, a mirror, a cross beam splitter, and a half wavelength plate.

According to the lamp fitting for a vehicle of the second aspect of the present invention, use of the characteristics (linear polarization) of the laser light sources can constitute the optical path that guides the laser light from at least one laser light source among the plurality of laser light sources to the incident end of the one or more optical fibers.

The lamp fitting for a vehicle according to a third aspect of present invention is the lamp fitting for a vehicle according to the first or second aspect, further including a laser light source control device configured to control the plurality of laser light sources so as to light up in predetermined order at an optical output every lapse of a predetermined time.

According to the lamp fitting for a vehicle of the third aspect of the present invention, in the lamp fitting for a vehicle including the plurality of the laser light sources, the heat radiation characteristics of the plurality of laser light sources can be improved (as a result, the lives of laser light sources can be improved, and the failure of the laser light sources can be prevented from occurring).

Unlike the conventional art causing the plurality of laser light sources to light up simultaneously and continuously, the plurality of laser light sources light up in predetermined order (i.e., the lighting time is distributed) to thereby distribute heat generation. The distribution is the cause of the improvement.

The lamp fitting for a vehicle according to a fourth aspect of present invention is the lamp fitting for a vehicle according to the third aspect, wherein when a temperature of an ambient environment is lower than a predetermined threshold value, the laser light source control device controls the plurality of laser light sources so as to light up in predetermined order at a first optical output every lapse of a predetermined time, and when the temperature of the ambient environment is higher than the predetermined threshold value, the laser light source control device controls the plurality of laser light sources so as to light up in predetermined order at a second optical output lower than the first optical output every lapse of the predetermined time.

According to the lamp fitting for a vehicle of the fourth aspect of the present invention, in the lamp fitting for a vehicle including the plurality of the laser light sources, the heat radiation characteristics of the plurality of laser light sources can be further improved (As a result, the lives of laser light sources can be further improved, and the failure of the laser light sources can be further prevented from occurring).

This is because the plurality of laser light sources are controlled so that the sources do not light up simultaneously and continuously as in the conventional art, but in the case where the temperature of the ambient environment is low (the temperature of the ambient environment<the predetermined threshold value) and in the case where the temperature of the ambient environment is high (the temperature of the ambient environment>the predetermined threshold value), the sources can light up according to each of the cases (i.e., the output is distributed).

The lamp fitting for a vehicle according to a fifth aspect of present invention is the lamp fitting for a vehicle according to the third or fourth aspect, further including an actuator that changes a disposition of at least one optical element among the plurality of optical elements so as to constitute an optical path that guides laser light from the lighting-up laser light source among the plurality of laser light sources to the incident end of the one or more optical fibers.

According to the lamp fitting for a vehicle of the fifth aspect of the present invention, the optical path that guides the laser light from the lighting-up laser light source among the plurality of laser light sources to the incident end of the one or more optical fibers can be constituted. As a result, even when some laser light sources among the plurality of laser light sources fail or when some optical elements (e.g., a mirror or a beam splitter) among the plurality of optical elements fail, the output can be compensated.

The lamp fitting for a vehicle according to a sixth aspect of present invention is the lamp fitting for a vehicle according to any one of the first to fifth aspects, wherein when at least one laser light source among the plurality of laser light sources fails, a laser light source other than the failed laser light source among the plurality of laser light sources is used.

According to the lamp fitting for a vehicle of the sixth aspect of the present invention, even when some of the plurality of laser light sources fail, the output can be compensated.

A seventh aspect of the present invention is a coupler/distributor, including: a plurality of laser light sources; one or more optical fiber attachments; and a plurality of optical elements which are disposed between the plurality of laser light sources and one or more optical fiber attachments, and constitute an optical path guiding laser light from at least one of the plurality of laser light sources to an incident end of one or more optical fibers connected to the one or more optical fiber attachments.

According to the coupler/distributor of the seventh aspect of the present invention, a coupler/distributor that can guide laser light from the plurality of laser light sources into the plurality of optical systems, and use the light in the plurality of optical systems can be provided.

This is because the plurality of optical elements that constitute an optical path guiding laser light from at least one of the plurality of laser light sources to the incident end of the one or more optical fibers connected to the one or more optical fiber attachments are disposed between the plurality of laser light sources and the one or more optical fiber attachments.

Furthermore, according to the coupler/distributor of the seventh aspect of the present invention, the laser light from the plurality of laser light sources can be guided to the plurality of optical systems. Consequently, no difference in lives of the laser light sources due to the frequencies in use of the respective optical systems occurs, and the lives of the laser light sources can be increased.

The coupler/distributor according to an eighth aspect of the present invention is the coupler/distributor according to the seventh aspect, wherein the optical elements include at least one of a beam splitter, a mirror, a cross beam splitter, and a half wavelength plate.

According to the coupler/distributor of the eighth aspect of the present invention, use of the characteristics (linear polarization) of the laser light sources can constitute the optical path that guides the laser light from at least one laser light source among the plurality of laser light sources to the incident end of the one or more optical fibers.

The coupler/distributor according to a ninth aspect of the present invention is the coupler/distributor according to the seventh or eighth aspect, further including a laser light source control device configured to control the plurality of laser light sources so as to light up in predetermined order at a predetermined optical output every lapse of a predetermined time.

According to the coupler/distributor of the ninth aspect of the present invention, the coupler/distributor can be provided that can improve the heat radiation characteristics of the plurality of laser light sources (resultantly can improve the lives of laser light sources, and prevent the failure of the laser light sources from occurring).

Unlike the conventional art causing the plurality of laser light sources to light up simultaneously and continuously, the plurality of laser light sources light up in predetermined order (i.e., the lighting time is distributed) to thereby distribute heat generation. The distribution is the cause of the improvement.

The coupler/distributor according to a tenth aspect of the present invention is the coupler/distributor according to the ninth aspect, wherein when a temperature of an ambient environment is lower than a predetermined threshold value, the laser light source control device controls the plurality of laser light sources so as to light up in predetermined order at a first optical output every lapse of a predetermined time, and when the temperature of the ambient environment is higher than the predetermined threshold value, the laser light source control device controls the plurality of laser light sources so as to light up in predetermined order at a second optical output lower than the first optical output every lapse of the predetermined time.

According to the coupler/distributor of the tenth aspect of the present invention, the heat radiation characteristics of the plurality of laser light sources can be further improved (as a result, the lives of laser light sources can be further improved, and the failure of the laser light sources can be further prevented from occurring).

This is because the plurality of laser light sources are controlled so that the sources do not light up simultaneously and continuously as in the conventional art, but in the case where the temperature of the ambient environment is low (the temperature of the ambient environment<the predetermined threshold value) and in the case where the temperature of the ambient environment is high (the temperature of the ambient environment>the predetermined threshold value), the sources light up according to each of the cases (i.e., the output is distributed).

The coupler/distributor according to an eleventh aspect of the present invention is the coupler/distributor according to the ninth or tenth aspect, further including an actuator that changes a disposition of at least one optical element among the plurality of optical elements so as to constitute an optical path that guides laser light from the lighting-up laser light source among the plurality of laser light sources to the incident end of the one or more optical fibers.

According to the coupler/distributor of the eleventh aspect of the present invention, the optical path that guides the laser light from the lighting-up laser light source among the plurality of laser light sources to the incident end of the one or more optical fibers can be constituted. As a result, even when some laser light sources among the plurality of laser light sources fail or when some optical elements (e.g., a mirror or a beam splitter) among the plurality of optical elements fail, the output can be compensated.

The coupler/distributor according to a twelfth aspect of the present invention is the coupler/distributor according to any one of the seventh to eleventh aspects, wherein when at least one laser light source among the plurality of laser light sources fails, a laser light source other than the failed laser light source among the plurality of laser light sources is used.

According to the coupler/distributor of the twelfth aspect of the present invention, even when some of the plurality of laser light sources fail, the output can be compensated.

Advantageous Effects of Invention

According to the present invention, first, in the lamp fitting for a vehicle that includes a plurality of laser light sources, laser light from the plurality of laser light sources can be introduced into the plurality of optical systems, and used in the plurality of Optical systems. Second, in the lamp fitting for a vehicle that includes the plurality of laser light sources, the heat radiation characteristics of the plurality of laser light sources can be improved (as a result, the lives of laser light sources can be improved). Third, the coupler/distributor can be provided that can guide laser light from the plurality of laser light sources into the plurality of optical systems, and use the light in the plurality of optical systems. Fourth, the coupler/distributor can be provided that can improve the heat radiation characteristics of the plurality of laser light sources (resultantly improve the lives of laser light sources).

DESCRIPTION OF EMBODIMENTS

A lamp fitting for a vehicle that includes a coupler/distributor according to one embodiment of the present invention is hereinafter described with reference to the drawings.

Figure 1:
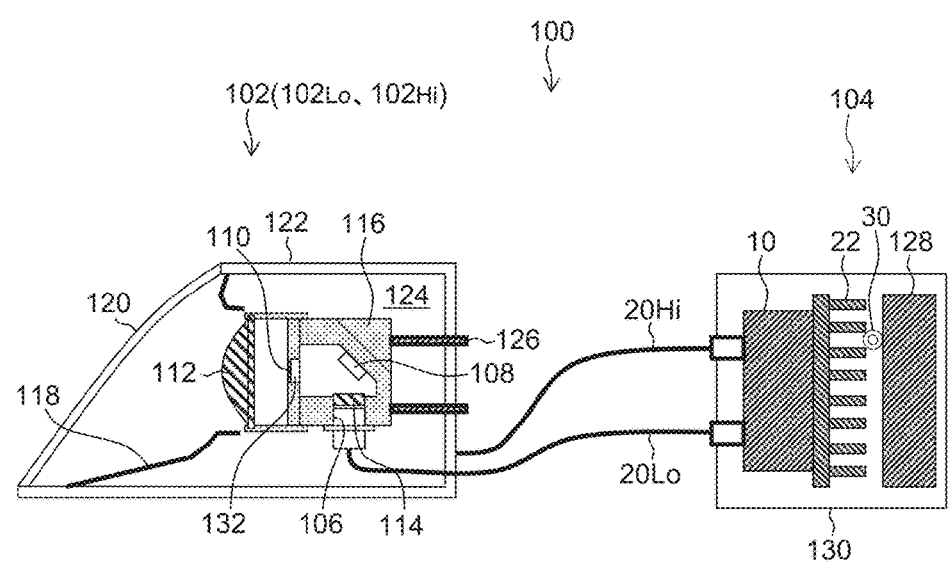
FIG. 1 is a schematic configuration diagram of a lamp fitting 100 for a vehicle using a coupler/distributor 10 of this embodiment.

FIG. 1 is a schematic configuration diagram of the lamp fitting 100 for a vehicle using the coupler/distributor 10 of this embodiment.

The lamp fitting 100 for a vehicle includes lamp fitting units 102 (corresponding to an optical system of the present invention), a light source module 104, two optical fibers $20_{Lo}$ and $20_{Hi}$ that connect the lamp fitting unit 102 and the light source module 104 to each other and the like. As the lamp fitting units 102, two lamp fitting units corresponding to the two optical fibers $20_{Lo}$ and $20_{Hi}$, i.e., the lamp fitting unit $102_{Lo}$ for the passing beam and the lamp fitting unit $102_{Hi}$ for a driving beam, are provided. It is a matter of course that the number of lamp fitting units 102 may be three or more. It is a matter of course that the number of optical fibers is three or more. The lamp fitting units are not limited to the lamp fitting unit $102_{Lo}$ for the passing beam and the lamp fitting unit $102_{Hi}$ for the driving beam. It is a matter of course that the units may be lamp fitting units for turn lamps, lamp fitting units for position lamps, lamp fitting units for fog lamps, lamp fitting units for DRL (Daylight Running Lamps), lamp fitting units for rear lamps, lamp fitting units for high mount stop lamps or other lamp fitting units.

The lamp fitting unit $102_{Lo}$ for the passing beam and the lamp fitting unit $102_{Hi}$ for the driving beam have substantially similar configurations. Consequently, the configuration of the lamp fitting unit $102_{Lo}$ for the passing beam is typified and hereinafter described.

The lamp fitting unit $102_{Lo}$ is a lamp fitting unit that is an optical system called a projector type, includes an optical fiber attachment 106, a mirror 108, a wavelength converting member 110, a projecting lens 112, a condenser lens 114, a cooling fins 116 and the like, and adopts, as a light source, the wavelength converting member 110 that is excited and emits light with laser light from the light source module 104 (coupler/distributor 10), the laser light being emitted from the emission end (emission end face) of the optical fiber $20_{Lo}$ connected to the optical fiber attachment 106 and being reflected by the mirror 108. The wavelength converting member 110 is fixed onto a light-transmitting support substrate 132. Note that the light-transmitting support substrate 132 may be omitted.

The lamp fitting unit $102_{Lo}$ is disposed in a lamp chamber 124 that includes an outer lens 120 and a housing 122 assembled thereto, together with an extension 118. A member designated by reference numeral 126 is an optical axis adjusting mechanism.

The light source module 104 includes the coupler/distributor 10, a power source 128 and the like. The coupler/distributor 10, the power source 128 and the like are accommodated in a casing 130 and configured into a module.

Blue laser light emitted from the optical fiber $20_{Lo}$ is optically adjusted by the condenser lens 114, is reflected by the mirror 108 and subsequently enters the support substrate 132 and the wavelength converting member 110. The wavelength converting member 110 receives the blue laser light, which excites fluorescent bodies included in the wavelength converting member 110 to emit yellow light. Thus, when the wavelength converting member 110 receives the blue laser light, blue laser light scattered by the wavelength converting member 110 is mixed with the yellow light. Consequently, white light is emitted from the wavelength converting member 110. Here, the structure is not limited to the structure where the laser light emitted from the optical fiber $20_{Lo}$ is optically adjusted by the condenser lens 114 and the like and is reflected by the mirror 108. Alternatively, for example, a configuration may be adopted where laser light emitted from the optical fiber $20_{Lo}$ enters the wavelength converting member 110 through the support substrate 132 or directly without intervention of the support substrate 132. Heat caused around the wavelength converting member 110 by the blue laser light entering the wavelength converting member 110 is dissipated via the support substrate 132 and the housing 122 and the cooling fins 116.

Figure 2:
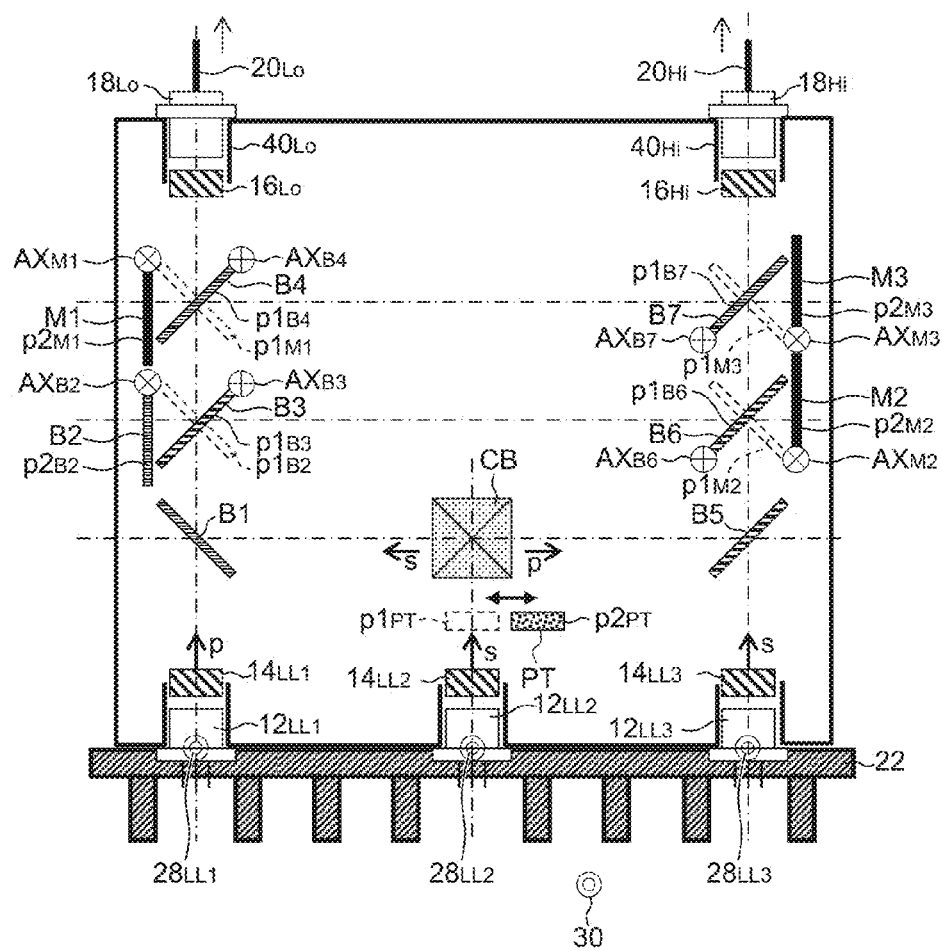
FIG. 2 is a schematic configuration diagram of the coupler/distributor.

FIG. 2 is a schematic configuration diagram of the coupler/distributor.

As shown in FIG. 2, the coupler/distributor 10 of this embodiment is configured as a coupler/distributor that includes a plurality of laser light sources $12_{LL1}$, $12_{LL2}$ and $12_{LL3}$, a plurality of collimating lenses $14_{LL1}$, $14_{LL2}$ and $14_{LL3}$, a plurality of condenser lenses $16_{Lo}$ and $16_{Hi}$, a plurality of optical fiber attachments $40_{Lo}$ and $40_{Hi}$, and a plurality of optical elements that constitute optical paths for guiding laser light from the laser light sources $12_{LL1}$, $12_{LL2}$ and $12_{LL3}$ to the first optical fiber attachment $40_{Lo}$ (the incident end (incident end face) of the first optical fiber $20_{Lo}$ connected thereto) or the second optical fiber attachment $40_{Hi}$ (the incident end (incident end face) of the second optical fiber $20_{Hi}$ connected thereto), that is, beam splitters B1 to B7, mirrors M1 to M3, a cross beam splitter CB, a half wavelength plate PT and the like. The plurality of optical elements are disposed between the laser light sources $12_{LL1}$, $12_{LL2}$ and $12_{LL3}$ and the optical fiber attachments $40_{Lo}$ and $40_{Hi}$ (the incident ends of the optical fibers $20_{Lo}$ and $20_{Hi}$ connected thereto). The beam splitters B1 to B7, the mirrors M1 to M3, the cross beam splitter CB, the half wavelength plate PT and the like are adopted as the plurality of optical elements. Consequently, through use of the characteristics (linear polarization) of the laser light sources (semiconductor lasers $LD_{LL1}$, $LD_{LL2}$ and $LD_{LL3}$), optical paths can be constituted that guide laser light from at least one of the laser light sources (semiconductor lasers $LD_{LL1}$, $LD_{LL2}$ and $LD_{LL3}$) to the incident end of the first optical fiber $20_{Lo}$ or the incident end of the second optical fiber $20_{Hi}$.

Description is hereinafter made on an example of using the three laser light sources $12_{LL1}$, $12_{LL2}$ and $12_{LL3}$ and the two optical fibers $20_{Lo}$ and $20_{Hi}$. The technique is not limited thereto. It is a matter of course that the number of laser light sources may be one, two or four or more, and the number of optical fibers may be one, two or four or more. As the optical elements, all of the beam splitters B1 to B7, the mirrors M1 to M3, the cross beam splitter CB, and the half wavelength plate PT are not necessarily required. The optical element may include at least one of these elements. Alternatively, optical elements other than these elements may be combined.

The laser light sources $12_{LL1}$, $12_{LL2}$ and $12_{LL3}$ includes semiconductor lasers $LD_{LL1}$, $LD_{LL2}$ and $LD_{LL3}$ accommodated in caps, photodiodes $PD_{LL1}$, $PD_{LL2}$ and $PD_{LL3}$ for monitoring and the like.

Figure 3:
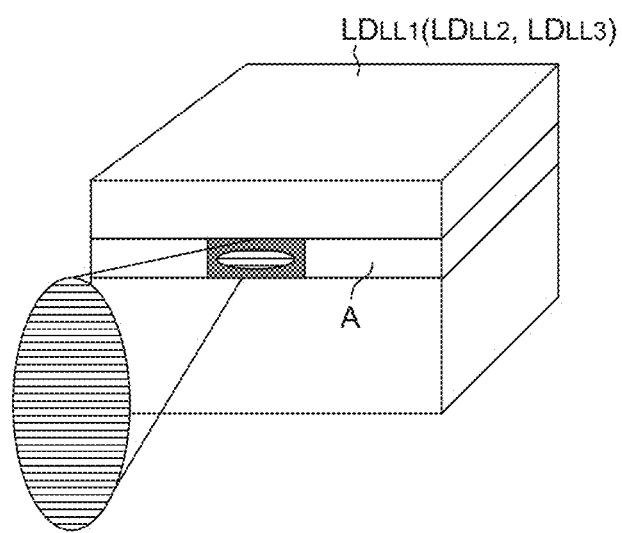
FIG. 3 is a schematic perspective view of a semiconductor laser $LD_{LL1}$, $LD_{LL2}$, $LD_{LL3}$.

FIG. 3 is a schematic perspective view of semiconductor lasers $LD_{LL1}$, $LD_{LL2}$ and $LD_{LL3}$.

As shown in FIG. 3, the semiconductor lasers $LD_{LL1}$, $LD_{LL2}$ and $LD_{LL3}$ are semiconductor light-emitting elements (laser diodes) that each emit laser light (linear polarization) in the TE mode (Transverse Electric mode) having an electric field component parallel to the junction plane A (active region). The semiconductor lasers $LD_{LL1}$, $LD_{LL2}$ and $LD_{LL3}$ also emit laser light in the TM mode (Transverse Magnetic mode) having an electric field component perpendicular to the junction plane A (active region). However, the laser light in the TE mode having a large gain is dominant. The light-emitting wavelengths of the semiconductor lasers $LD_{LL1}$, $LD_{LL2}$ and $LD_{LL3}$ are in the blue range (e.g., 450 nm). The range may be the near-ultraviolet region (e.g., 405 nm).

Figure 4:
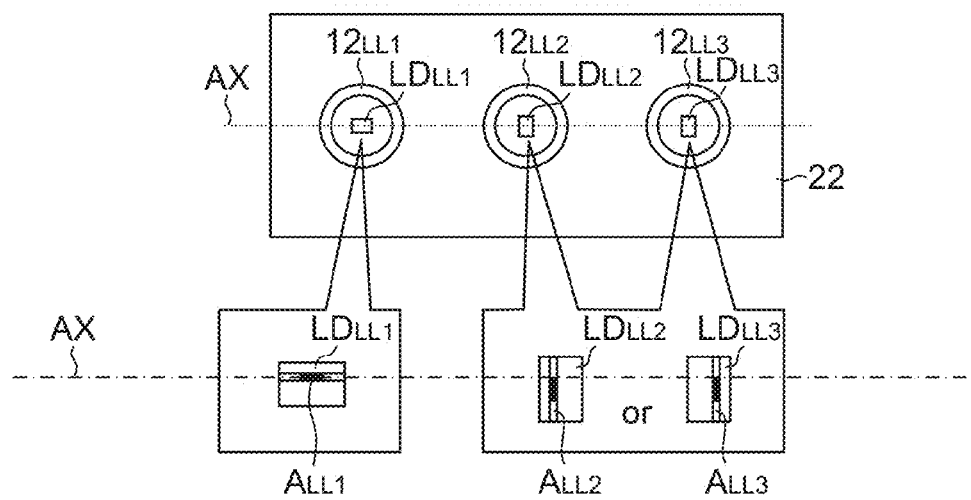
FIG. 4 is a diagram for illustrating the relationship between each of the junction planes $A_{LL1}$, $A_{LL2}$ and $A_{LL3}$ of the semiconductor lasers $LD_{LL1}$, $LD_{LL2}$ and $LD_{LL3}$ and a reference axis AX.

As shown in FIG. 2, the laser light sources $12_{LL1}$, $12_{LL2}$ and $12_{LL3}$ are fixed onto a radiator plate 22. Here, as shown in FIG. 4, the first laser light source $12_{LL1}$ is disposed so that the junction plane $A_{LL1}$ can be parallel to the reference axis AX. Such a disposition allows the laser light emitted from the laser light source $12_{LL1}$ to enter the first beam splitter B1, described below, as p-polarized light. Meanwhile, the second and third laser light sources $12_{LL2}$ and $12_{LL3}$ are disposed so that the junction planes $A_{LL2}$ and $A_{LL3}$ can each be perpendicular to the reference axis AX. Such a disposition allows the laser light emitted from the laser light sources $12_{LL2}$ and $12_{LL3}$ to enter the after-mentioned fifth beam splitter B5, and the cross beam splitter CB in the case where the half wavelength plate PT is disposed at a retracted position $p2_{PT}$, as s-polarized light.

As shown in FIG. 2, the first beam splitter B1 is a beam splitter that allows p-polarized light to pass therethrough and reflects s-polarized light, and is disposed in the optical path of the laser light from the first laser light source $12_{LL1}$ (semiconductor laser $LD_{LL1}$).

The second beam splitter B2 is a beam splitter that allows p-polarized light to pass therethrough and reflects s-polarized light, is rotated about a rotational axis $AX_{B2}$, and is arranged at an inserted position $p1_{B2}$ where the splitter is inserted in the optical path of the laser light from the first laser light source $12_{LL1}$ (first semiconductor laser $LD_{LL1}$) or at a retracted position $p2_{B2}$ where the splitter is retracted from the optical path of the laser light from the first laser light source $12_{LL1}$ (first semiconductor laser $LD_{LL1}$). This is achieved by an actuator control device 24a controlling an actuator (not shown) provided in conformity with the second beam splitter B2.

The third beam splitter B3 is a beam splitter that reflects p-polarized light and allows s-polarized light to pass therethrough, is moved along an axis $AX_{B3}$ extending in a direction orthogonal to the sheet of FIG. 2, and is arranged at an inserted position $p1_{B3}$ where the splitter is inserted in the optical path of the laser light from the first laser light source $12_{LL1}$ (first semiconductor laser $LD_{LL1}$) or at a retracted position $p2_{B3}$ where the splitter is retracted from the optical path of the laser light from the first laser light source $12_{LL1}$ (first semiconductor laser $LD_{LL1}$). This is achieved by the actuator control device 24a controlling an actuator (not shown) provided in conformity with the third beam splitter B3.

The first mirror M1 is rotated about a rotational axis $AX_{M1}$, and is arranged at an inserted position $p1_{M1}$ where the mirror is inserted in the optical path of the laser light from the first laser light source $12_{LL1}$ (first semiconductor laser $LD_{LL1}$) or at a retracted position $p2_{M1}$ where the mirror is retracted from the optical path of the laser light from the first laser light source $12_{LL1}$ (first semiconductor laser $LD_{LL1}$). This is achieved by the actuator control device 24a controlling an actuator (not shown) provided in conformity with the first mirror M1.

The fourth beam splitter B4 is a beam splitter that allows p-polarized light to pass therethrough and reflects s-polarized light, is moved along an axis $AX_{B4}$ extending in a direction orthogonal to the sheet of FIG. 2, and is arranged at an inserted position $p1_{B4}$ where the splitter is inserted in the optical path of the laser light from the first laser light source $12_{LL1}$ (first semiconductor laser $LD_{LL1}$) or at a retracted position $p2_{B4}$ where the splitter is retracted from the optical path of the laser light from the first laser light source $12_{LL1}$ (first semiconductor laser $LD_{LL1}$). This is achieved by the actuator control device 24a controlling an actuator (not shown) provided in conformity with the fourth beam splitter B4.

The fifth beam splitter B5 is a beam splitter that reflects p-polarized light and allows s-polarized light to pass therethrough, and is disposed in the optical path of the laser light from the third laser light source $12_{LL3}$ (third semiconductor laser $LD_{LL3}$).

The second mirror M2 is rotated about a rotational axis $AX_{M2}$, and is arranged at an inserted position $p1_{M2}$ where the mirror is inserted in the optical path of the laser light from the third laser light source $12_{LL3}$ (third semiconductor laser $LD_{LL3}$) or at a retracted position $p2_{M2}$ where the mirror is retracted from the optical path of the laser light from the third laser light source $12_{LL3}$ (third semiconductor laser $LD_{LL3}$). This is achieved by the actuator control device 24a controlling an actuator (not shown) provided in conformity with the second mirror M2.

The sixth beam splitter B6 is a beam splitter that reflects p-polarized light and allows s-polarized light to pass therethrough, is moved along an axis $AX_{B6}$ extending in a direction orthogonal to the sheet of FIG. 2, and is arranged at an inserted position $p1_{B6}$ where the splitter is inserted in the optical path of the laser light from the third laser light source $12_{LL3}$ (third semiconductor laser $LD_{LL3}$) or at a retracted position $p2_{B6}$ where the splitter is retracted from the optical path of the laser light from the third laser light source $12_{LL3}$ (third semiconductor laser $LD_{LL3}$). This is achieved by the actuator control device 24a controlling an actuator (not shown) provided in conformity with the sixth beam splitter B6.

The third mirror M3 is rotated about a rotational axis $AX_{M3}$, and is arranged at an inserted position $p1_{M3}$ where the mirror is inserted in the optical path of the laser light from the third laser light source $12_{LL3}$ (third semiconductor laser $LD_{LL3}$) or at a retracted position $p2_{M3}$ where the mirror is retracted from the optical path of the laser light from the third laser light source $12_{LL3}$ (third semiconductor laser $LD_{LL3}$). This is achieved by the actuator control device 24a controlling an actuator (not shown) provided in conformity with the third mirror M3.

The seventh beam splitter B7 is a beam splitter that allows p-polarized light to pass therethrough and reflects s-polarized light, is moved along an axis $AX_{B7}$ extending in a direction orthogonal to the sheet of FIG. 2, and is arranged at an inserted position $p1_{B7}$ where the splitter is inserted in the optical path of the laser light from the third laser light source $12_{LL3}$ (third semiconductor laser $LD_{LL3}$) or at a retracted position $p2_{B7}$ where the splitter is retracted from the optical path of the laser light from the third laser light source $12_{LL3}$ (third semiconductor laser $LD_{LL3}$). This is achieved by the actuator control device 24a controlling an actuator (not shown) provided in conformity with the seventh beam splitter B7.

The half wavelength plate PT is disposed at an inserted position $p1_{PT}$ where the plate is inserted in the optical path of the laser light from the second laser light source $12_{LL2}$ (second semiconductor laser $LD_{LL2}$) or at a retracted position $p2_{PT}$ where the plate is retracted from the optical path of the laser light from the second laser light source $12_{LL2}$ (second semiconductor laser $LD_{LL2}$). This is achieved by the actuator control device 24a controlling an actuator (not shown) provided in conformity with the half wavelength plate PT.

The cross beam splitter CB is a beam splitter that reflects the s-polarized light toward the first beam splitter B1 upon the s-polarized light having entered the splitter, and reflects the p-polarized light toward the fifth beam splitter B5 upon the p-polarized light having entered the splitter, and is disposed in the optical path of the laser light from the second laser light source $12_{LL2}$ (second semiconductor laser $LD_{LL2}$).

Next, the functional configuration of the coupler/distributor 10 having the aforementioned configuration is described with reference to FIG. 5.

Figure 5:
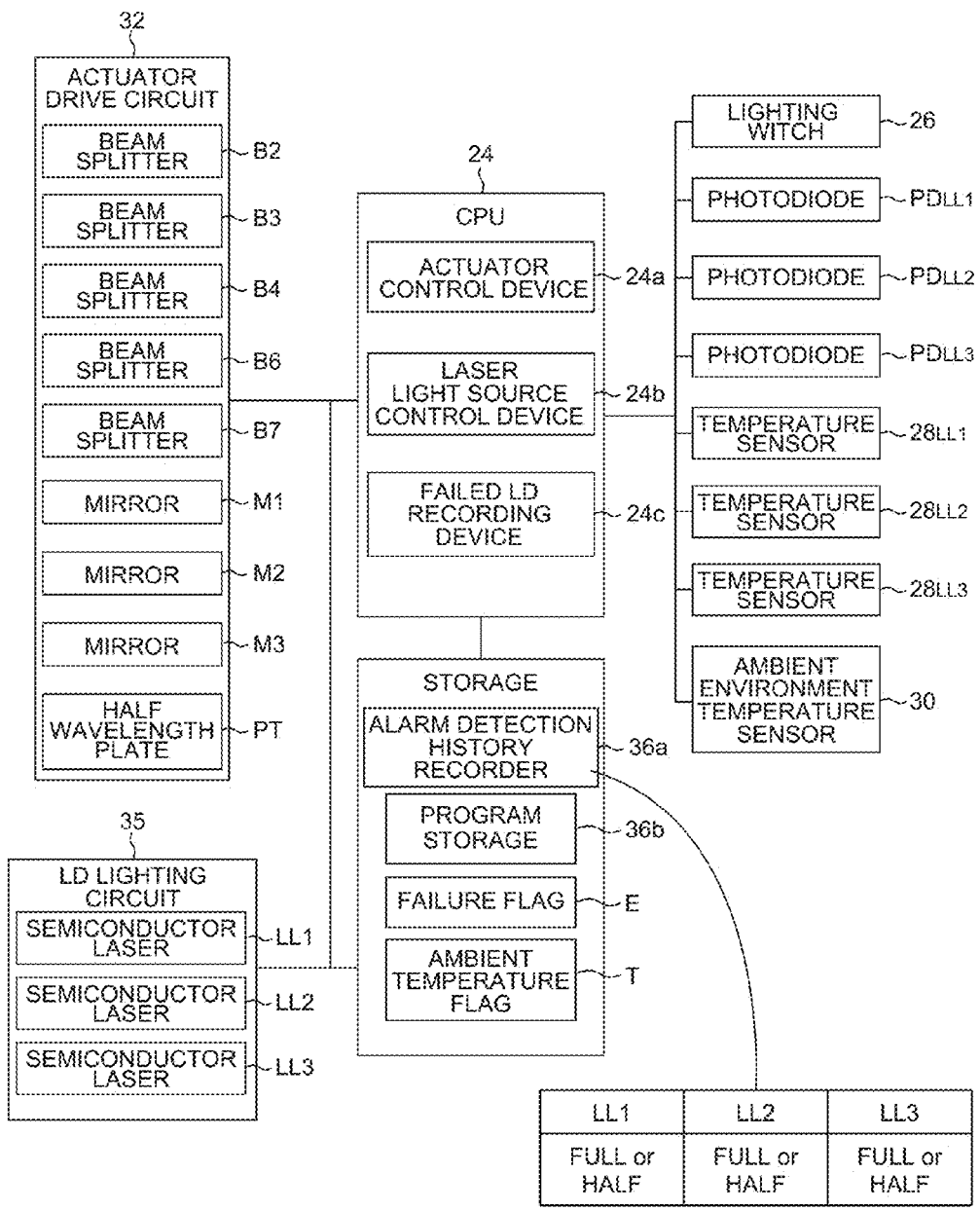
FIG. 5 is a functional block diagram that shows the functional configuration of the coupler/distributor 10.

FIG. 5 is a functional block diagram that shows the functional configuration of the coupler/distributor 10.

As shown in FIG. 5, the coupler/distributor 10 includes a CPU (Central Processing Unit) 24 that controls the entire operation. The CPU 24 is connected, via a bus, with a lighting switch 26, photodiodes $PD_{LL1}$, $PD_{LL2}$ and $PD_{LL3}$, temperature sensors $28_{LL1}$, $28_{LL2}$ and $28_{LL3}$, an ambient environment temperature sensor 30, actuators (not shown) provided in conformity with the respective beam splitters B2, B3, B4, B6 and B7, actuators (not shown) provided in conformity with the respective mirrors M1 to M3, an actuator drive circuit 32 that controls each of the actuators, an LD lighting circuit 34 that supplies current to each of the semiconductor lasers $LD_{LL1}$, $LD_{LL2}$ and $LD_{LL3}$, an alarm detection history recorder 36a that records the correspondence relationship between the semiconductor lasers $LD_{LL1}$, $LD_{LL2}$ and $LD_{LL3}$ and their lighting states, a program storage 36b that stores various programs executed by the CPU 24, an RAM (Random Access Memory; not shown) that is used as a working area and the like.

The CPU 24 executes a predetermined program having been read from the program storage 36b into the RAM or the like to thereby function as the actuator control device 24a, laser light source (semiconductor laser) control device 24b, failed LD (semiconductor laser) recording device 24c and the like.

Next, the operation of the coupler/distributor 10 having the aforementioned configuration (the operation during passing beam lighting) is described with reference to FIG. 6.

Figure 6:
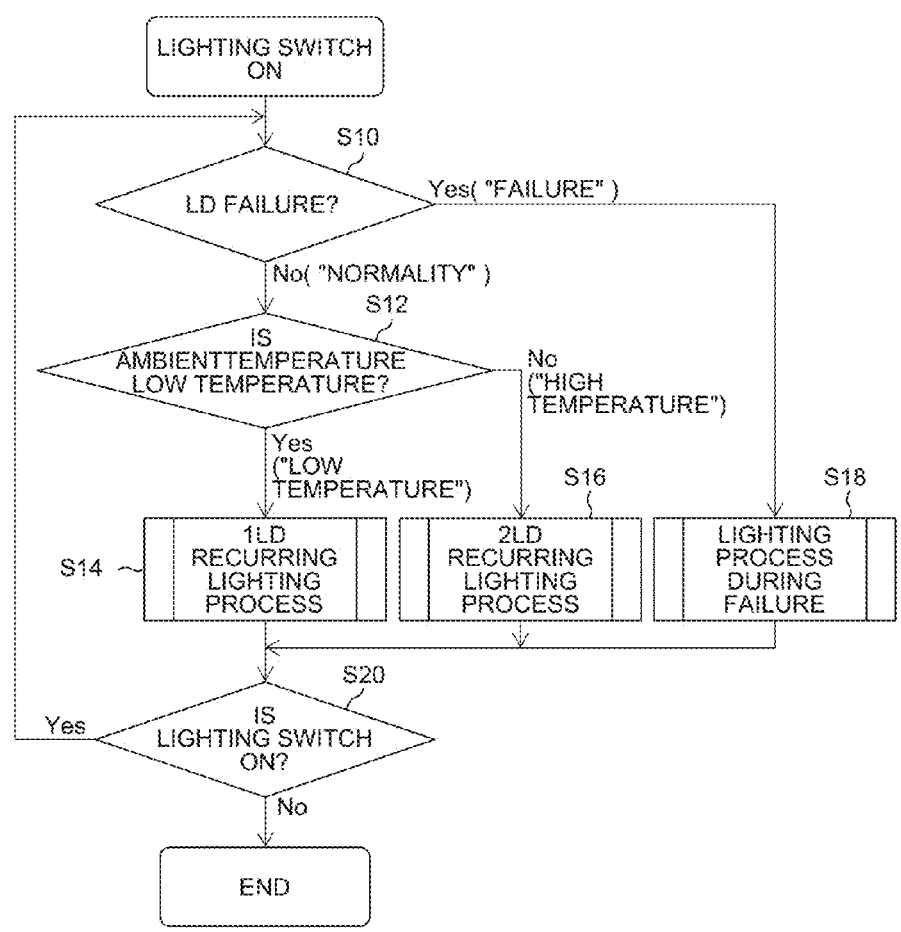
FIG. 6 is a flowchart showing a basic operation of the coupler/distributor 10.

FIG. 6 is a flowchart showing a basic operation of the coupler/distributor 10.

The following processes are achieved by the CPU 24 executing the predetermined program having been read from the program storage 36b into the RAM or the like.

When the lighting switch 26 is turned on (i.e., passing beam lighting up is instructed), it is determined first whether the semiconductor lasers $LD_{LL1}$, $LD_{LL2}$ and $LD_{LL3}$ are in failure or not (step S10). This is determined according to whether a failure flag E stored in the RAM or the like stores content indicating failure (e.g., "1") or not.

When it is determined that the semiconductor lasers $LD_{LL1}$, $LD_{LL2}$ and $LD_{LL3}$ are not in failure (step S10: No), it is then determined whether the ambient temperature is a low temperature or not (step S12). This is determined according to whether an ambient temperature flag T stored in the RAM or the like stores content indicating a low temperature (e.g., "0") or not. When the output (value) of the ambient environment temperature sensor 30>the predetermined threshold value, the ambient temperature flag T is set to the content indicating that the ambient environment temperature is a high temperature (e.g., "1"). On the contrary, when the output of the ambient environment temperature sensor 30<the predetermined threshold value, this flag is set to the content indicating that the ambient environment temperature is a low temperature (e.g., "0").

When the ambient temperature is determined to be a low temperature (step S12: Yes), the 1LD recurring lighting process (step S14) is executed.

Figure 7:
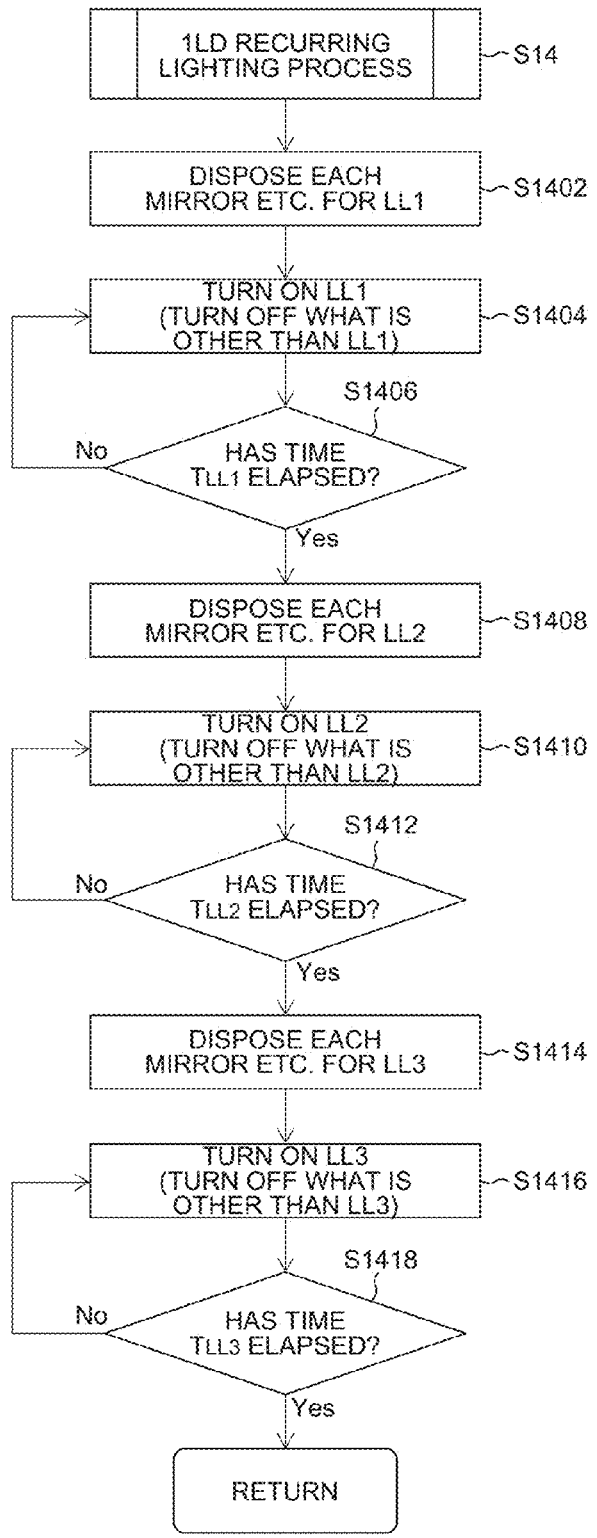
FIG. 7 is a flowchart showing a 1LD recurring lighting process (step S14).

FIG. 7 is a flowchart showing the 1LD recurring lighting process (step S14).

The 1LD recurring lighting process is a process of controlling the semiconductor lasers $LD_{LL1}$, $LD_{LL2}$ and $LD_{LL3}$ so as to light up one by one in predetermined order at a predetermined first optical output (FULL output) every lapse of a predetermined time. This process is also effective for the case where the number of lamp fitting units 102 is only one, for example, the case where the lamp fitting unit 102 is only the lamp fitting unit $102_{Lo}$ for the passing beam (or the lamp fitting unit $102_{Hi}$ for the driving beam). In this case, the beam splitters B3, B4, B6 and B7 may be omitted.

Hereinafter, the case where the semiconductor lasers $LD_{LL1}$, $LD_{LL2}$ and $LD_{LL3}$ light up in order of the first semiconductor laser $LD_{LL1}$ to second semiconductor laser $LD_{LL2}$ to third semiconductor laser $LD_{LL3}$ (repetition thereafter) is described. It is a matter of course that the order may be other than this order.

Figure 8:
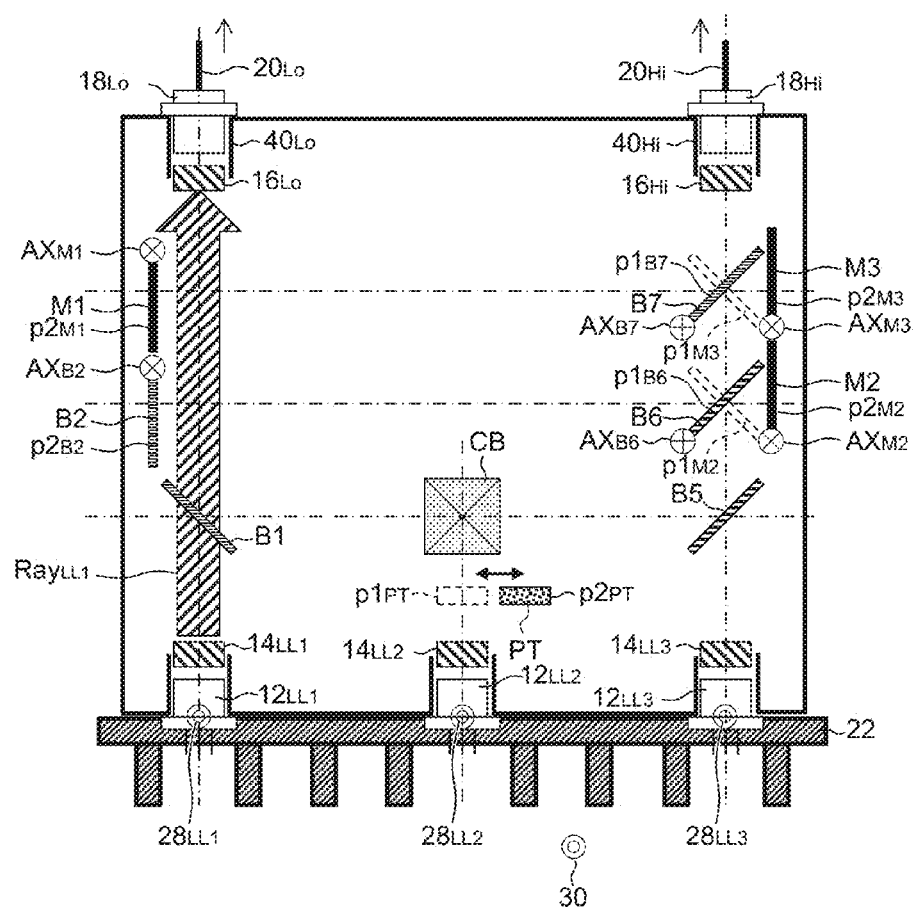
FIG. 8 is a diagram showing the optical path of laser light $Ray_{LL1}$ from the first semiconductor laser $LD_{LL1}$ in the 1LD recurring lighting process (during passing beam lighting).

First, as shown in FIG. 8, in order to constitute an optical path that guides the laser light $Ray_{LL1}$ from the first semiconductor laser $LD_{LL1}$ to the first optical fiber attachment $40_{Lo}$ (the incident end of the first optical fiber $20_{Lo}$ connected thereto), the second beam splitter B2 and the first mirror M1 are disposed at the respective retracted positions $p2_{B2}$ and $p2_{M1}$ (the case of having been disposed at the inserted positions) (step S1402). This is achieved by the actuator control device 24a controlling actuators (not shown) provided in conformity with the second beam splitter B2 and the first mirror M1.

Next, the laser light source control device 24b controls the LD lighting circuit 34 so that the first semiconductor laser $LD_{LL1}$ can light up at the predetermined first optical output (FULL output) (and the second semiconductor laser $LD_{LL2}$ and the third semiconductor laser $LD_{LL3}$ can be in idle states) (step S1404).

As shown in FIG. 8, the laser light $Ray_{LL1}$ from the first semiconductor laser $LD_{LL1}$ enters the first beam splitter B1 as p-polarized light and passes this splitter, is condensed by the condenser lens $16_{Lo}$ and enters the first optical fiber attachment $40_{Lo}$ (the incident end of the first optical fiber $20_{Lo}$ connected thereto). The light propagates to the lamp fitting unit $102_{Lo}$ for the passing beam through the first optical fiber $20_{Lo}$, and is used to form a light distribution pattern for the passing beam.

Figure 9:
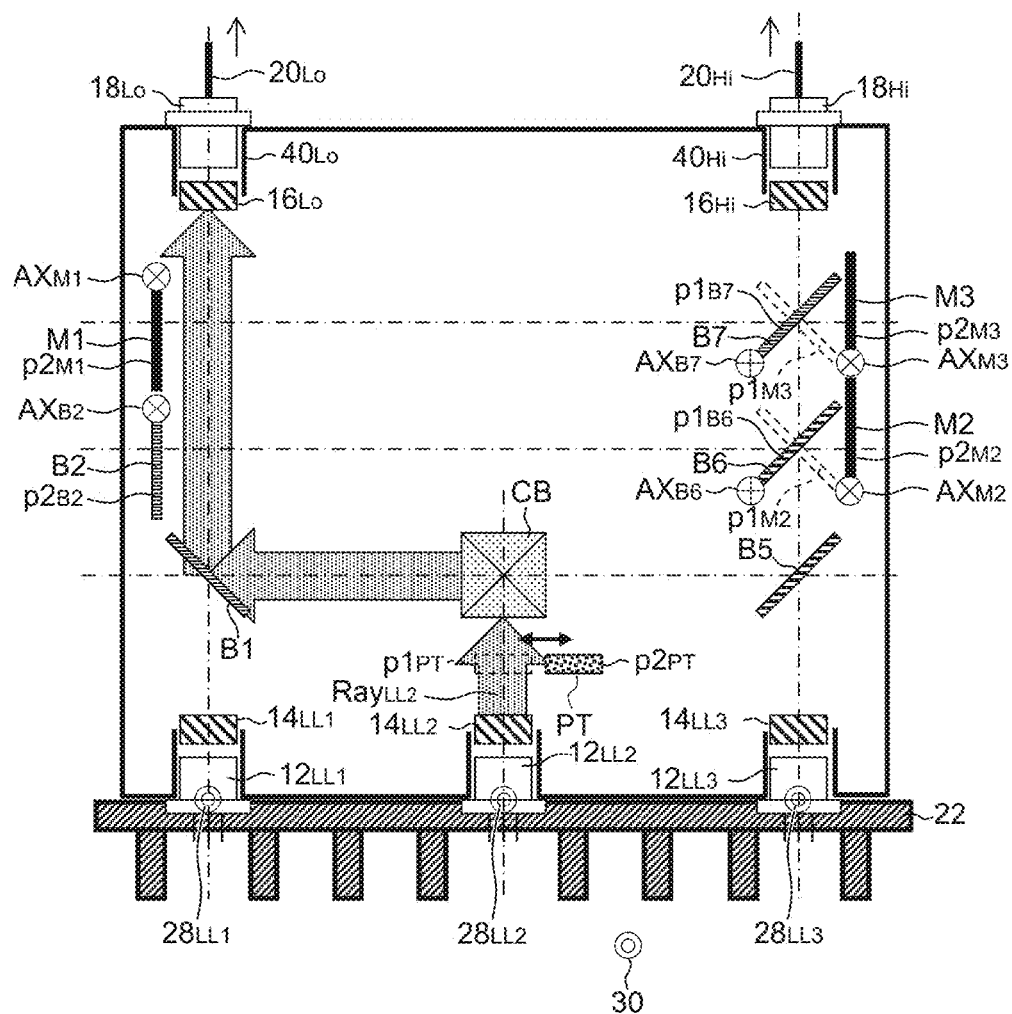
FIG. 9 is a diagram showing the optical path of laser light $Ray_{LL2}$ from the second semiconductor laser $LD_{LL2}$ in the 1LD recurring lighting process (during passing beam lighting).

Next, it is determined whether a predetermined time $T_{LL1}$ has elapsed or not (step S1406). When it is determined that the predetermined time $T_{LL1}$ has elapsed (step S1406: Yes), as shown in FIG. 9, in order to constitute an optical path that guides the laser light $Ray_{LL2}$ from the second semiconductor laser $LD_{LL2}$ to the first optical fiber attachment $40_{Lo}$ (the incident end of the first optical fiber $20_{Lo}$ connected thereto), the second beam splitter B2, the first mirror M1 and the half wavelength plate PT are disposed at the respective retracted positions $p2_{B2}$, $p2_{M1}$ and $p2_{PT}$ (the case of having been disposed at inserted positions) (step S1408). This is achieved by the actuator control device 24a controlling actuators (not shown) provided in conformity with the second beam splitter B2, the first mirror M1 and the half wavelength plate PT.

Next, the laser light source control device 24b controls the LD lighting circuit 34 so that the second semiconductor laser $LD_{LL2}$ can light up at the predetermined first optical output (FULL output) (and the first semiconductor laser $LD_{LL1}$ and the third semiconductor laser $LD_{LL3}$ can be in idle states) (step S1410).

As shown in FIG. 9, the laser light $Ray_{LL2}$ from the second semiconductor laser $LD_{LL2}$ enters the cross beam splitter CB as s-polarized light and is reflected by the cross beam splitter CB toward the first beam splitter B1, is further reflected by the first beam splitter B1, is condensed by the condenser lens $16_{Lo}$ and enters the first optical fiber attachment $40_{Lo}$ (the incident end of the first optical fiber $20_{Lo}$ connected thereto). The light propagates to the lamp fitting unit $102_{Lo}$ for the passing beam through the first optical fiber $20_{Lo}$ and is used to form a light distribution pattern for the passing beam.

Figure 10:
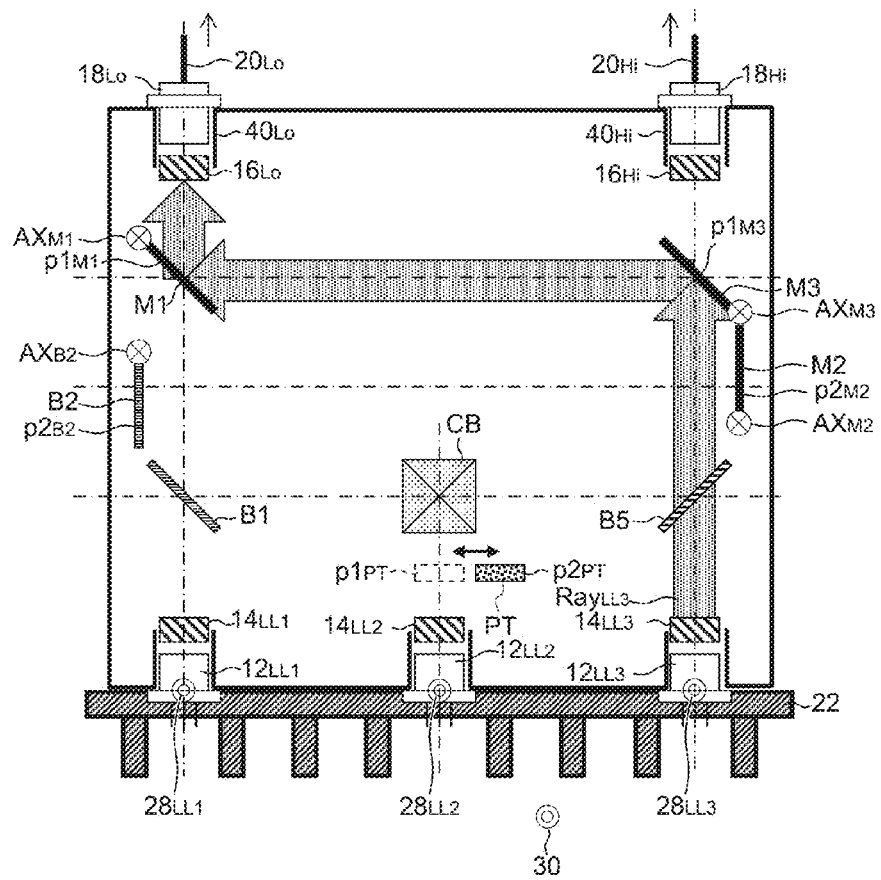
FIG. 10 is a diagram showing the optical path of laser light $Ray_{LL3}$ from the third semiconductor laser $LD_{LL3}$ in the 1LD recurring lighting process (during passing beam lighting).

Next, it is determined whether a predetermined time $T_{LL2}$ has elapsed or not (step S1412). When it is then determined that the predetermined time $T_{LL2}$ has elapsed (step S1412: Yes), as shown in FIG. 10, in order to constitute an optical path that guides the laser light $Ray_{LL3}$ from the third semiconductor laser $LD_{LL3}$ to the first optical fiber attachment $40_{Lo}$ (the incident end of the first optical fiber $20_{Lo}$ connected thereto), the first mirror M1 and the third mirror M3 are disposed at the respective inserted positions $p1_{M1}$ and $p1_{M3}$ (the case of having been disposed at the retracted positions) (step S1414). All of the other elements are disposed at the respective retracted positions. This is achieved by the actuator control device 24a controlling actuators (not shown) provided in conformity with the first mirror M1, the third mirror M3 and the like.

Next, the laser light source control device 24b controls the LD lighting circuit 34 so that the third semiconductor laser $LD_{LL3}$ can light up at the predetermined first optical output (FULL output) (and the first semiconductor laser $LD_{LL1}$ and the second semiconductor laser $LD_{LL2}$ can be in the idle states) (step S1416).

As shown in FIG. 10, the laser light $Ray_{LL3}$ from the third semiconductor laser $LD_{LL3}$ enters the fifth beam splitter B5 as s-polarized light and passes this splitter, is reflected by the third mirror M3 and the first mirror M1, is condensed by the condenser lens $16_{Lo}$ and enters the first optical fiber attachment $40_{Lo}$ (the incident end of the first optical fiber $20_{Lo}$ connected thereto). The light propagates to the lamp fitting unit $102_{Lo}$ for the passing beam through the first optical fiber $20_{Lo}$, and is used to form a light distribution pattern for the passing beam.

Next, it is determined whether a predetermined time $T_{LL3}$ has elapsed or not (step S1418). When it is then determined that the predetermined time $T_{LL3}$ has elapsed (step S1418: Yes), the processing proceeds to step S20.

The 1LD recurring lighting process (step S14) is repeated until it is determined that the lighting switch 26 is not on (step S20: No).

The lighting times $T_{LL1}$ to $T_{LL3}$ of the semiconductor lasers $LD_{LL1}$ to $LD_{LL3}$ may be even or uneven.

As described above, the semiconductor lasers $LD_{LL1}$, $LD_{LL2}$ and $LD_{LL3}$ are controlled so as to light up one by one in predetermined order at the predetermined first optical output (FULL output) every lapse of the predetermined time, thereby allowing the heat generation source to be distributed (temporally distributed) on the radiator plate 22. Consequently, an advantageous effect analogous to that in the case of including a heat spreader can be obtained, and the heat radiation efficiency is improved. That is, the lives of the semiconductor lasers $LD_{LL1}$ to $LD_{LL3}$ are improved and failure is prevented. In the 1LD recurring lighting process (step S14), the operation time of the semiconductor lasers $LD_{LL1}$ to $LD_{LL3}$ can be divided equally among three. Consequently, the lives of the semiconductor lasers $LD_{LL1}$ to $LD_{LL3}$ can be increased about three times.

Figure 11:
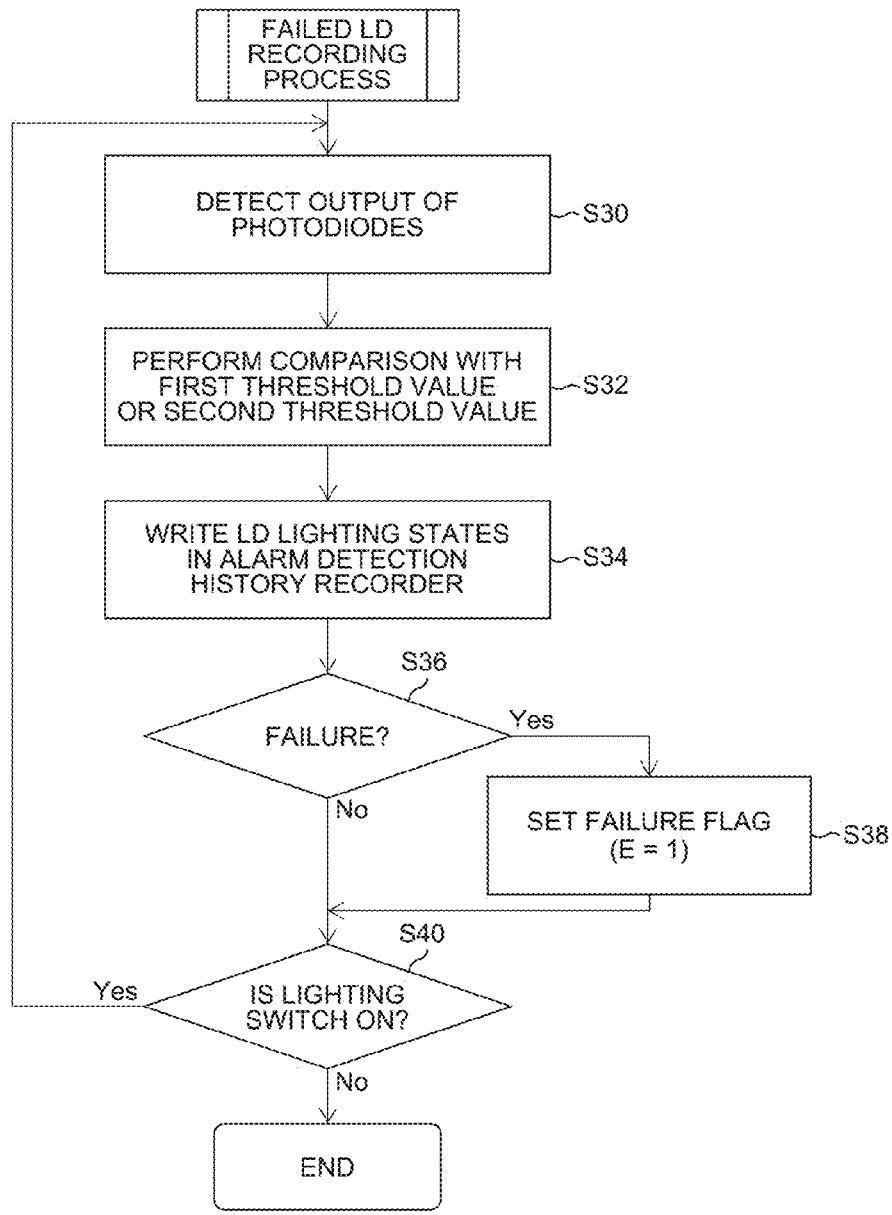
FIG. 11 is a flowchart showing a failed LD recording process.

As described above, while the semiconductor lasers $LD_{LL1}$, $LD_{LL2}$ and $LD_{LL3}$ are controlled so as to light up one by one in predetermined order at the predetermined first optical output (FULL output) every lapse of a predetermined time (steps S1402 to S1418), the failed LD recording device 24c executes the failed LD recording process shown in FIG. 11 in parallel.

That is, the failed LD recording device 24c successively detects the outputs of the photodiodes $PD_{LL1}$, $PD_{LL2}$ and $PD_{LL3}$ (step S30), compares the detected outputs (output values) with a predetermined first threshold value (a threshold value for determining whether the FULL output is exceeded or not) (step S32), determines the lighting states of the semiconductor lasers $LD_{LL1}$, $LD_{LL2}$ and $LD_{LL3}$ on the basis of the comparison result, and writes the determination result in the alarm detection history recorder 36a (step S34).

For example, when all the outputs of the photodiodes $PD_{LL1}$, $PD_{LL2}$ and $PD_{LL3}$ are higher than the first threshold value, the failed LD recording device 24c determines that the lighting states of all the semiconductor lasers $LD_{LL1}$, $LD_{LL2}$ and $LD_{LL3}$ are FULL, and writes the correspondence relationships between the semiconductor lasers $LD_{LL1}$, $LD_{LL2}$ and $LD_{LL3}$ and the respective lighting state (FULL) in the alarm detection history recorder 36a. In this case, all the semiconductor lasers $LD_{LL1}$, $LD_{LL2}$ and $LD_{LL3}$ light up at the first optical output (FULL output) as intended. Consequently, the content indicating normality (e.g., "0") is stored in the failure flag E.

On the other hand, when at least one photodiode, for example, the output of the first photodiode $PD_{LL1}$ is lower than the first threshold value, the failed LD recording device 24c determines that the lighting state of the first semiconductor lasers $LD_{LL1}$ is not FULL, and writes the correspondence relationship between the first semiconductor laser $LD_{LL1}$ and the lighting state (not FULL) in the alarm detection history recorder 36a. In this case, the semiconductor lasers $LD_{LL1}$ does not light up at the first optical output (FULL output) which is intended. Consequently, the content indicating failure (e.g., "1") is stored in the failure flag E (step S38).

The failed LD recording process (steps S30 to S40) is repeated until it is determined that the lighting switch 26 is not on (step S40: No).

On the other hand, when the ambient temperature is determined to be a high temperature (step S12: No), the 2LD recurring lighting process (step S16) is executed.

Figure 12:
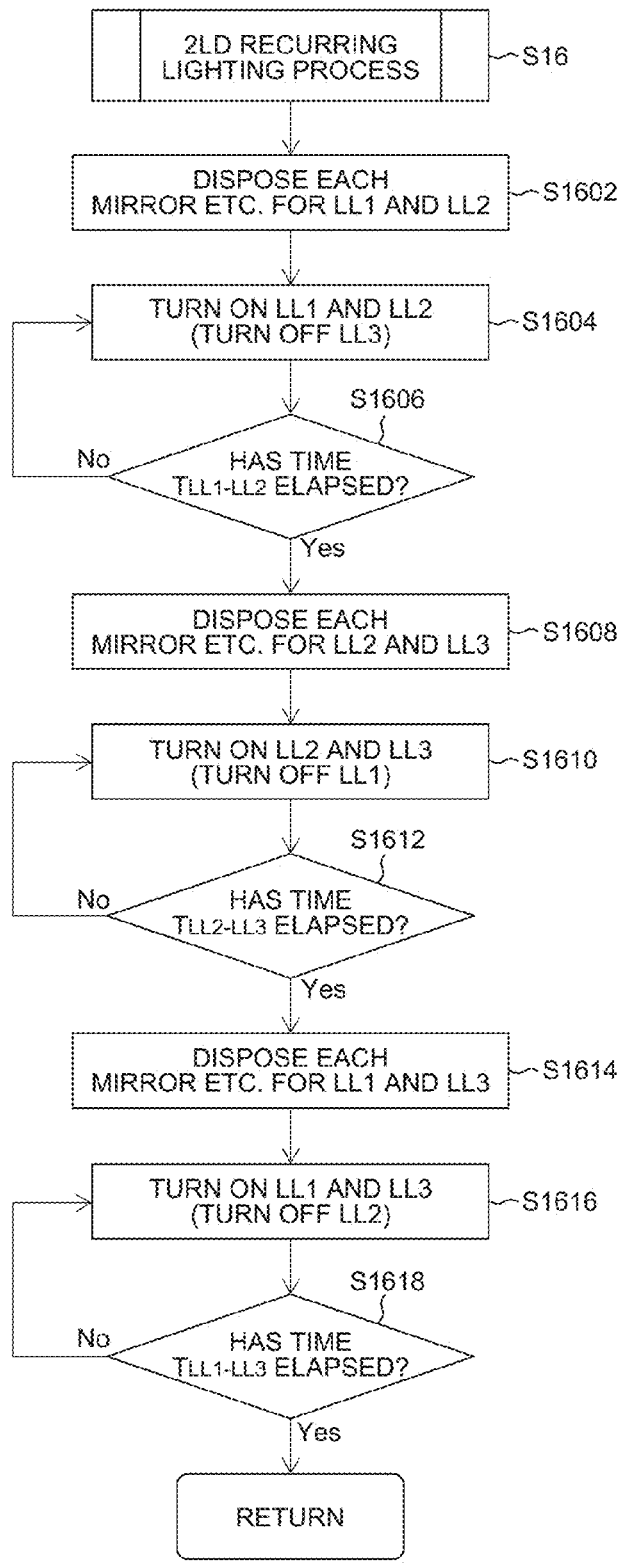
FIG. 12 is a flowchart showing a 2LD recurring lighting process (step S16).

FIG. 12 is a flowchart showing the 2LD recurring lighting process (step S16).

The 2LD recurring lighting process is a process of controlling the semiconductor lasers $LD_{LL1}$, $LD_{LL2}$ and $LD_{LL3}$ so as to light up two by two in predetermined order at a predetermined second optical output (HALF output that is half a FULL output) every lapse of a predetermined time. This process is also effective for the case where the number of lamp fitting units 102 is only one, for example, the case where the lamp fitting unit 102 is only the lamp fitting unit $102_{Lo}$ for the passing beam (or the lamp fitting unit $102_{Hi}$ for the driving beam). In this case, the beam splitters B3, B4, B6 and B7 may be omitted.

Hereinafter, the case where the semiconductor lasers $LD_{LL1}$, $LD_{LL2}$ and $LD_{LL3}$ light up in order of the semiconductor lasers $LD_{LL1}$ and $LD_{LL2}$ to semiconductor lasers $LD_{LL2}$ and $LD_{LL3}$ to semiconductor lasers $LD_{LL1}$ and $LD_{LL3}$ . . . (repetition thereafter) is described. It is a matter of course that the order may be other than this order.

Figure 13:
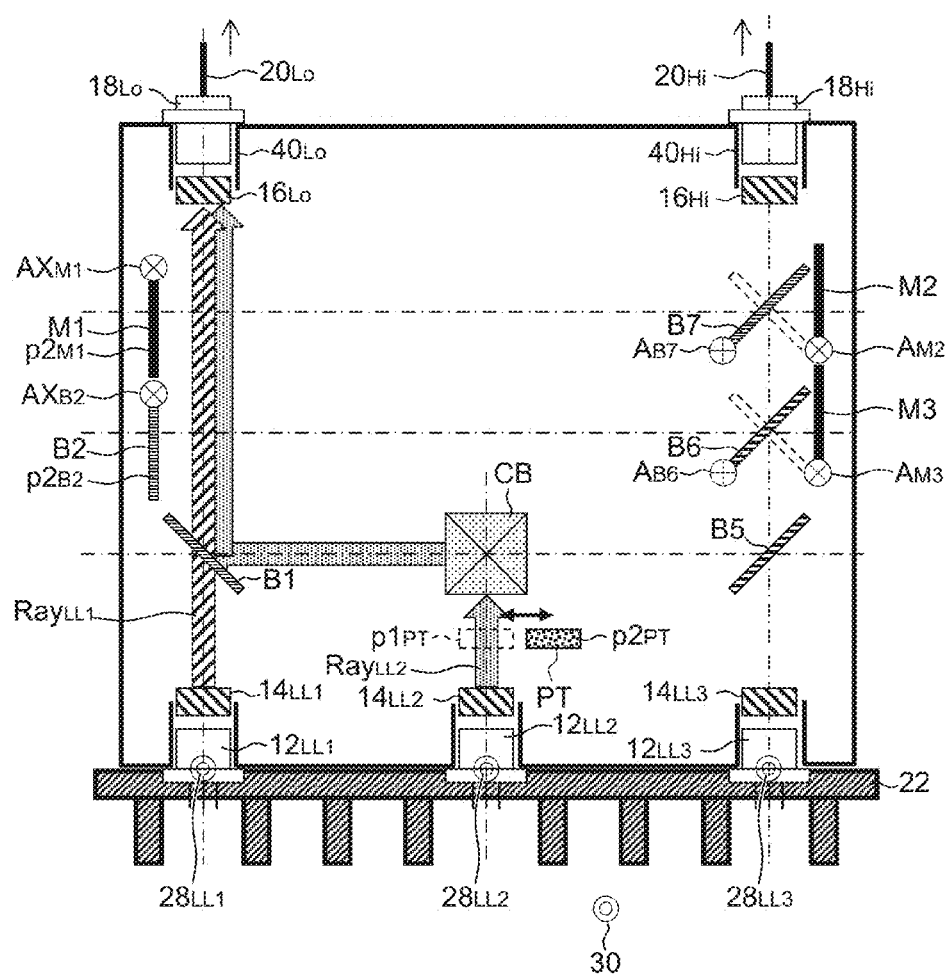
FIG. 13 is a diagram showing the optical paths of laser light $Ray_{LL1}$ and, $Ray_{LL2}$ from the semiconductor lasers $LD_{LL1}$ and $LD_{LL2}$ in the 2LD recurring lighting process (during passing beam lighting).

First, as shown in FIG. 13, in order to constitute optical paths that guide the laser light $Ray_{LL1}$ and $Ray_{LL2}$ from the first semiconductor laser $LD_{LL1}$ and the second semiconductor laser $LD_{LL2}$ to the first optical fiber attachment $40_{Lo}$ (the incident end of the first optical fiber $20_{Lo}$ connected thereto), the second beam splitter B2, the first mirror M1 and the half wavelength plate PT are disposed at the respective retracted positions $p2_{B2}$, $p2_{M1}$ and $p2_{PT}$ (the case of having been disposed at the inserted positions) (step S1602). This is achieved by the actuator control device 24a controlling actuators (not shown) provided in conformity with the second beam splitter B2, the first mirror M1 and the half wavelength plate PT.

Next, the laser light source control device 24b controls the LD lighting circuit 34 so that the first semiconductor laser $LD_{LL1}$ and the second semiconductor laser $LD_{LL2}$ can light up at a predetermined second optical output (HALF output that is half a FULL output) (and the third semiconductor laser $LD_{LL3}$ can be in the idle state) (step S1604).

As shown in FIG. 13, the laser light $Ray_{LL1}$ from the first semiconductor laser $LD_{LL1}$ enters the first beam splitter B1 as p-polarized light and passes this splitter, is condensed by the condenser lens $16_{Lo}$ and enters the first optical fiber attachment $40_{Lo}$ (the incident end of the first optical fiber $20_{Lo}$ connected thereto). Meanwhile, the laser light $Ray_{LL2}$ from the second semiconductor laser $LD_{LL2}$ enters the cross beam splitter CB as s-polarized light and is reflected by the cross beam splitter CB toward the first beam splitter B1, is further reflected by the first beam splitter B1, is condensed by the condenser lens $16_{Lo}$ and enters the first optical fiber attachment $40_{Lo}$ (the incident end of the first optical fiber $20_{Lo}$ connected thereto). The laser light propagates to the lamp fitting unit $102_{Lo}$ for the passing beam through the first optical fiber $20_{Lo}$, and is used to form a light distribution pattern for the passing beam.

Figure 14:
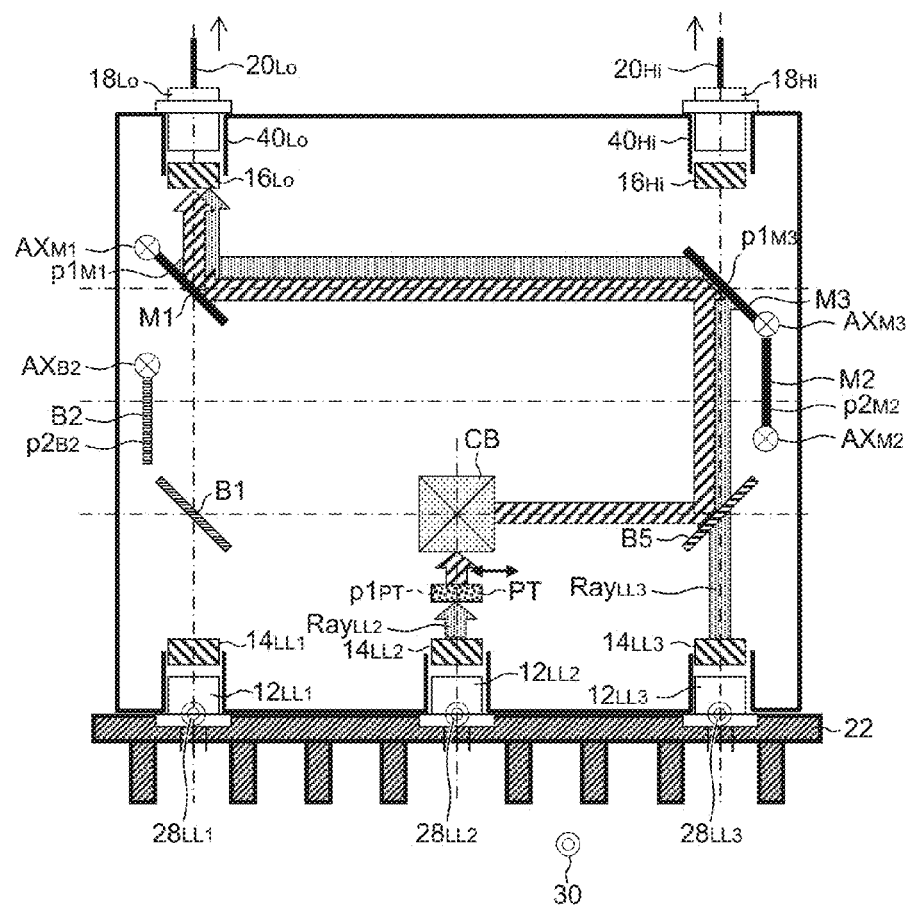
FIG. 14 is a diagram showing the optical paths of laser light $Ray_{LL2}$ and $Ray_{LL3}$ from the semiconductor lasers $LD_{LL2}$ and $LD_{LL3}$ in the 2LD recurring lighting process (during passing beam lighting).

Next, it is determined whether a predetermined time $T_{LL1-LL2}$ has elapsed or not (step S1606). When it is then determined that the predetermined time $T_{LL1-LL2}$ has elapsed (step S1606: Yes), as shown in FIG. 14, in order to constitute optical paths that guide the laser light $Ray_{LL2}$ and $Ray_{LL3}$ from the second semiconductor laser $LD_{LL2}$ and the third semiconductor laser $LD_{LL3}$ to the first optical fiber attachment $40_{Lo}$ (the incident end of the first optical fiber $20_{Lo}$ connected thereto), the half wavelength plate PT, the first mirror M1 and the third mirror M3 are disposed at the respective inserted positions $p1_{PT}$, $p1_{M1}$ and $p1_{M3}$ (the case of having been disposed at the retracted positions) (step S1608). All of the other elements are disposed at the respective retracted positions. This is achieved by the actuator control device 24a controlling actuators (not shown) provided in conformity with the half wavelength plate PT, the first mirror M1, the third mirror M3 and the like.

Next, the laser light source control device 24b controls the LD lighting circuit 34 so that the second semiconductor laser $LD_{LL2}$ and the third semiconductor laser $LD_{LL3}$ can light up at a predetermined second optical output (HALF output that is half a FULL output) (and the first semiconductor laser $LD_{LL1}$ can be in the idle state) (step S1610).

As shown in FIG. 14, the laser light $Ray_{LL2}$ from the second semiconductor laser $LD_{LL2}$ enters the half wavelength plate PT as s-polarized light and is emitted from the half wavelength plate PT as p-polarized light, enters the cross beam splitter CB as p-polarized light, is reflected by this cross beam splitter CB toward the fifth beam splitter B5, and is further reflected by the fifth beam splitter B5, the third mirror M3 and the first mirror M1, is condensed by the condenser lens $16_{Lo}$ and enters the first optical fiber attachment $40_{Lo}$ (the incident end of the first optical fiber $20_{Lo}$ connected thereto). Meanwhile, the laser light $Ray_{LL3}$ from the third semiconductor laser $LD_{LL3}$ enters the fifth beam splitter B5 as s-polarized light and passes this splitter, is reflected by the third mirror M3 and the first mirror M1, is condensed by the condenser lens $16_{Lo}$ and enters the first optical fiber attachment $40_{Lo}$ (the incident end of the first optical fiber $20_{Lo}$ connected thereto). The laser light propagates to the lamp fitting unit $102_{Lo}$ for the passing beam through the first optical fiber $20_{Lo}$, and is used to form a light distribution pattern for the passing beam.

Figure 15:
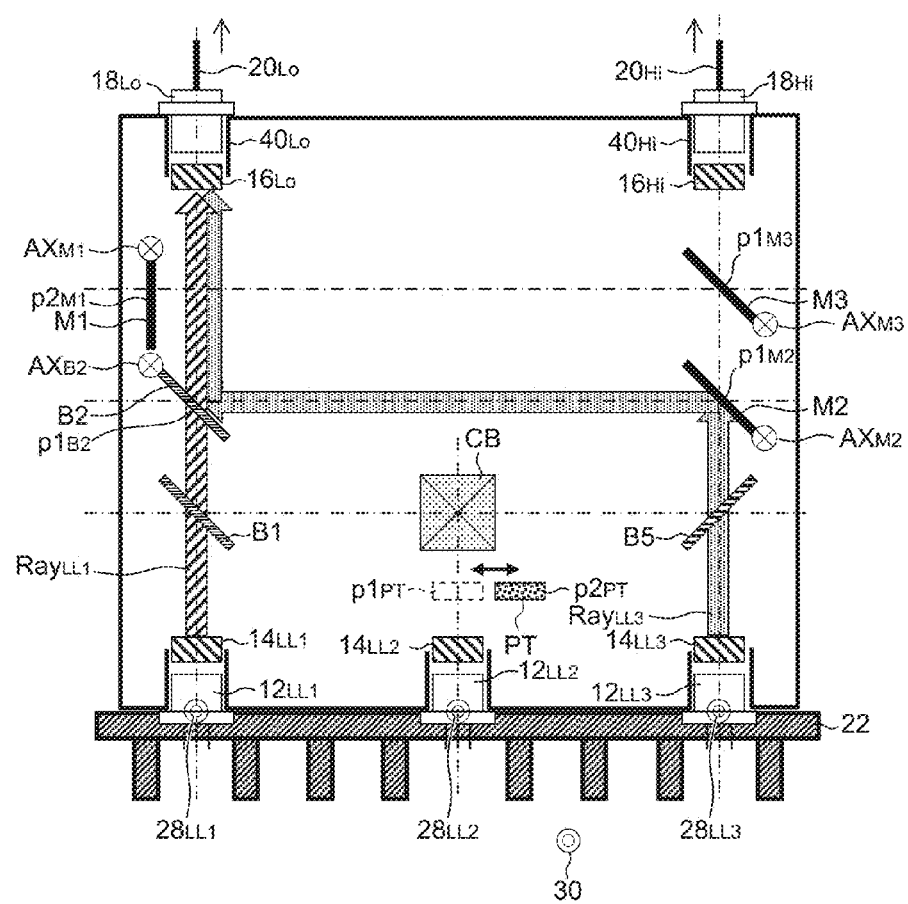
FIG. 15 is a diagram showing the optical paths of laser light $Ray_{LL1}$ and $Ray_{LL3}$ from the semiconductor lasers $LD_{LL1}$ and $LD_{LL3}$ in the 2LD recurring lighting process (during passing beam lighting).

Next, it is determined whether a predetermined time $T_{LL2-LL3}$ has elapsed or not (step S1612). When it is determined that the predetermined time $T_{LL2-LL3}$ has elapsed (step S1612: Yes), as shown in FIG. 15, in order to constitute optical paths that guide the laser light $Ray_{LL1}$ and $Ray_{LL3}$ from the first semiconductor laser $LD_{LL1}$ and the third semiconductor laser $LD_{LL3}$ to the first optical fiber attachment $40_{Lo}$ (the incident end of the first optical fiber $20_{Lo}$ connected thereto), the second beam splitter B2 and the second mirror M2 are disposed at the respective inserted positions $p1_{B2}$ and $p1_{M2}$ (the case of having been disposed at retracted positions) (step S1614). All of the other elements are disposed at the respective retracted positions. This is achieved by the actuator control device 24a controlling actuators (not shown) provided in conformity with the second beam splitter B2 and the second mirror M2.

Next, the laser light source control device 24b controls the LD lighting circuit 34 so that the first semiconductor laser $LD_{LL1}$ and the third semiconductor laser $LD_{LL3}$ can light up at the predetermined second optical output (HALF output that is half a FULL output) (and the second semiconductor laser $LD_{LL2}$ can be in the idle state) (step S1616).

As shown in FIG. 15, the laser light $Ray_{LL1}$ from the first semiconductor laser $LD_{LL1}$ enters the first beam splitter B1 and the second beam splitter B2 as p-polarized light and passes these splitters, is condensed by the condenser lens $16_{Lo}$ and enters the first optical fiber attachment $40_{Lo}$ (the incident end of the first optical fiber $20_{Lo}$ connected thereto). Meanwhile, the laser light $Ray_{LL3}$ from the third semiconductor laser $LD_{LL3}$ enters the fifth beam splitter B5 as s-polarized light and passes this splitter, is reflected by the second mirror M2 and the second beam splitter B2, is condensed by the condenser lens $16_{Lo}$ and enters the first optical fiber attachment $40_{Lo}$ (the incident end of the first optical fiber $20_{Lo}$ connected thereto). The laser light propagates to the lamp fitting unit $102_{Lo}$ for the passing beam through the first optical fiber $20_{Lo}$, and is used to form a light distribution pattern for the passing beam.

Next, it is determined whether the predetermined time $T_{LL1-LL3}$ has elapsed or not (step S1618). When it is determined that the predetermined time $T_{LL1-LL3}$ has elapsed (step S1618: Yes), the processing proceeds to step S20.

The 2LD recurring lighting process (step S16) is repeated until it is determined that the lighting switch 26 is not on (step S20: No).

The lighting times $T_{LL1-LL2}$ to $T_{LL1-LL3}$ of the semiconductor lasers $LD_{LL1}$ to $LD_{LL3}$ may be even or uneven.

As described above, the semiconductor lasers $LD_{LL1}$, $LD_{LL2}$ and $LD_{LL3}$ are controlled so as to light up two by two in predetermined order at the predetermined second optical output (HALF output that is half a FULL output) every lapse of the predetermined time. Consequently, the output loads on the semiconductor lasers $LD_{LL1}$ to $LD_{LL3}$ can be reduced while the heat generation source can be distributed (output distribution) on the radiator plate 22 at the same time. Thus, an advantageous effect analogous to that in the case of including the heat spreader can be obtained, and the heat radiation efficiency can be improved. The thermal resistance of the heat radiation system is constant over the entire system. Consequently, reduction in output can halve the increase in temperature ΔTj at a junction section. That is, the lives of the semiconductor lasers $LD_{LL1}$ to $LD_{LL3}$ are improved and failure is prevented. In the 2LD recurring lighting process (step S16), the operation time of the semiconductor lasers $LD_{LL1}$ to $LD_{LL3}$ can be divided equally among three, and the output loads on the semiconductor lasers $LD_{LL1}$ to $LD_{LL3}$ can be halved. Consequently, the lives of the semiconductor lasers $LD_{LL1}$ to $LD_{LL3}$ can be increased about three times.

As described above, when the temperature of the ambient environment is lower than the predetermined threshold value, the laser light source control device 24b controls the laser light sources (semiconductor lasers $LD_{LL1}$ to $LD_{LL3}$) to light up in predetermined order at the first optical output (FULL output) every lapse of a predetermined time. On the contrary, when the temperature of the ambient environment is higher than the predetermined threshold value, the device controls the laser light sources (semiconductor lasers $LD_{LL1}$ to $LD_{LL3}$) to light up in predetermined order at the second optical output (HALF output) lower than the first optical output every lapse of the predetermined time.

Thus, in the lamp fitting for a vehicle including the plurality of laser light sources (semiconductor lasers $LD_{LL1}$ to $LD_{LL3}$) (e.g., the lamp fitting unit $102_{Lo}$ for the passing beam and the lamp fitting unit $102_{Hi}$ for the driving beam), the heat radiation characteristics of the plurality of laser light sources (semiconductor lasers $LD_{LL1}$ to $LD_{LL3}$) can be further improved (as a result, the lives of the laser light sources (semiconductor lasers $LD_{LL1}$ to $LD_{LL3}$) can be further improved, and failure in the laser light sources (semiconductor lasers $LD_{LL1}$ to $LD_{LL3}$) can be further prevented from occurring).

This is because the plurality of laser light sources (semiconductor lasers $LD_{LL1}$ to $LD_{LL3}$) are controlled so that the sources do not light up simultaneously and continuously as in the conventional art, but in the case where the temperature of the ambient environment is low (the temperature of the ambient environment<the predetermined threshold value) and in the case where the temperature of the ambient environment is high (the temperature of the ambient environment>the predetermined threshold value), the sources light up according to each of the cases (i.e., the output is distributed).

As described above, while the semiconductor lasers $LD_{LL1}$, $LD_{LL2}$ and $LD_{LL3}$ are controlled so as to light up two by two in predetermined order at the predetermined second optical output (HALF output that is half a FULL output) every lapse of a predetermined time (steps S1602 to S1618), the failed LD recording device 24c executes the failed LD recording process shown in FIG. 11 in parallel.

That is, the failed LD recording device 24c successively detects the outputs of the photodiodes $PD_{LL1}$, $PD_{LL2}$ and $PD_{LL3}$ (step S30), compares the detected outputs (output values) with a second threshold value (a threshold value for determining whether the HALF output is exceeded or not (step S32), determines the lighting states of the semiconductor lasers $LD_{LL1}$, $LD_{LL2}$ and $LD_{LL3}$ on the basis of the comparison result, and writes the determination result in the alarm detection history recorder 36a (step S34).

For example, when all the outputs of the photodiodes $PD_{LL1}$, $PD_{LL2}$ and $PD_{LL3}$ are higher than the second threshold value, the failed LD recording device 24c determines that the lighting states of all the semiconductor lasers $LD_{LL1}$, $LD_{LL2}$ and $LD_{LL3}$ are HALF, and writes the correspondence relationships between the semiconductor lasers $LD_{LL1}$, $LD_{LL2}$ and $LD_{LL3}$ and the respective lighting state (HALF) in the alarm detection history recorder 36a. In this case, all the semiconductor lasers $LD_{LL1}$, $LD_{LL2}$ and $LD_{LL3}$ light up at the second optical output (HALF output) as intended. Consequently, the content indicating normality (e.g., "0") is stored in the failure flag E.

On the other hand, when at least one photodiode, for example, the output of the first photodiode $PD_{LL1}$ is lower than the second threshold value, the failed LD recording device 24c determines that the lighting state of the first semiconductor lasers $LD_{LL1}$ is not HALF, and writes the correspondence relationship between the semiconductor laser $LD_{LL1}$ and the lighting state (not HALF) in the alarm detection history recorder 36a. In this case, the semiconductor lasers $LD_{LL1}$ does not light up at the second optical output (HALF output) which is intended. Consequently, the content indicating failure (e.g., "1") is stored in the failure flag E (step S38).

The failed LD recording process (steps S30 to S40) is repeated until it is determined that the lighting switch 26 is not on (step S40: No).

Next, the lighting process during failure (fail-safe process) executed when it is determined that the semiconductor lasers $LD_{LL1}$, $LD_{LL2}$ and $LD_{LL3}$ are in failure (step S10: Yes) is described.

Figure 16:
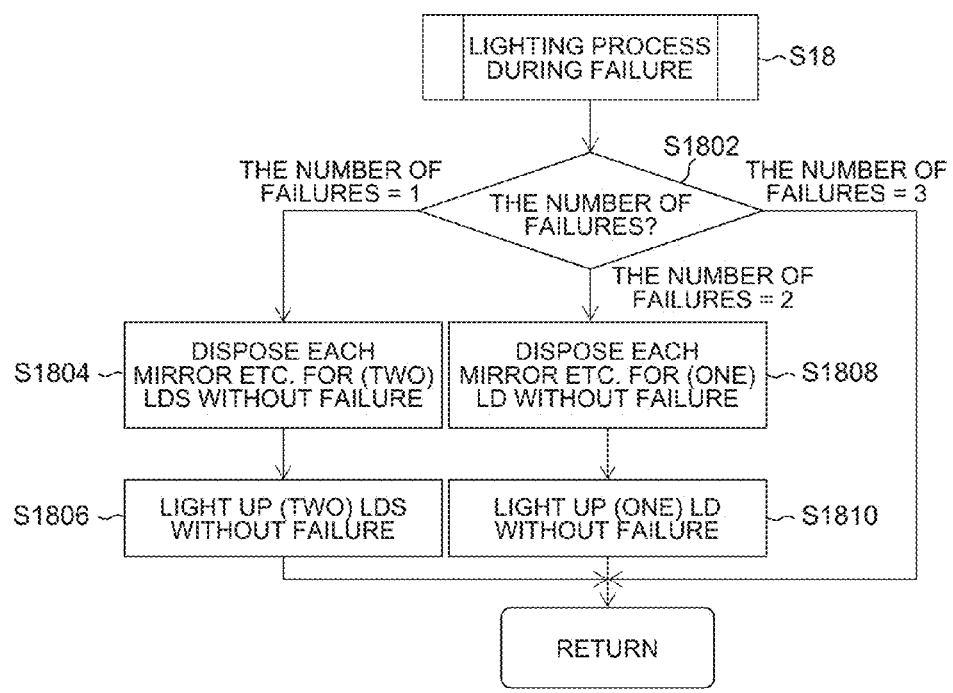
FIG. 16 is a flowchart showing a lighting process during failure (step S18).

FIG. 16 is a flowchart showing a lighting process during failure (step S18).

First, as shown in FIG. 16, the number of failed LDs (and identified failed LDs) is grasped (step S1802). This is achieved by the laser light source control device 24b referring to the content recorded in the alarm detection history recorder 36a.

When the number of failures is "1" (step S1802: the number of failures=1), the plurality of optical elements, that is, the beam splitters B2, B3, B4, B6 and B7, the mirrors M1 to M3 and the half wavelength plate PT, are disposed in the retracted positions or inserted positions so as to constitute optical paths that guide the laser light from two semiconductor lasers without failure to the optical fiber attachment $40_{Lo}$ (the incident end of the optical fiber $20_{Lo}$ attached thereto) (step S1804). This is achieved by the actuator control device 24a controlling each actuator.

For example, when the third semiconductor laser $LD_{LL3}$ fails, the beam splitters B2, B3, B4, B6 and B7, the mirrors M1 to M3 and the half wavelength plate PT are disposed at the retracted positions or inserted positions, as shown in FIG. 13.

Next, the laser light source control device 24b controls the LD lighting circuit 34 so that the two semiconductor lasers without failure (e.g., the semiconductor lasers $LD_{LL1}$ and $LD_{LL2}$ shown in FIG. 13) can light up (simultaneously light up) at the predetermined second optical output (HALF output that is half a FULL output) (step S1806).

Alternatively, the LD lighting circuit 34 may be controlled so that the two semiconductor lasers without failure (e.g., the semiconductor lasers $LD_{LL1}$ and $LD_{LL2}$ shown in FIG. 13) can light up at the predetermined first optical output (FULL output) (1LD recurring lighting process).

On the other hand, when the number of failures is "2" (step S1802: the number of failures=2), the plurality of optical elements, that is, the beam splitters B2, B3, B4, B6 and B7, the mirrors M1 to M3 and the half wavelength plate PT, are disposed in the retracted positions or inserted positions so as to constitute optical paths that guide the laser light from one semiconductor laser without failure to the optical fiber attachment $40_{Lo}$ (the incident end of the optical fiber $20_{Lo}$ attached thereto) (step S1808). This is achieved by the actuator control device 24a controlling each actuator.

For example, when the semiconductor lasers $LD_{LL2}$ and $LD_{LL3}$ fail, the beam splitters B2, B3, B4, B6 and B7, the mirrors M1 to M3 and the half wavelength plate PT are disposed at the retracted positions or inserted positions, as shown in FIG. 8.

Next, the laser light source control device 24b controls the LD lighting circuit 34 so that the one semiconductor laser without failure (e.g., the semiconductor laser $LD_{LL1}$ shown in FIG. 8) can light up at the predetermined first optical output (FULL output) (step S1810).

The lighting process during failure (step S18) is repeated until it is determined that the lighting switch 26 is not on (step S20: No).

As described above, when at least one of the plurality of laser light sources (semiconductor lasers $LD_{LL1}$ to $LD_{LL3}$) fails, a laser light source other than the failed laser sources among the plurality of laser light sources (semiconductor lasers $LD_{LL1}$ to $LD_{LL3}$) can be used.

Consequently, even when some of the plurality of laser light sources (semiconductor lasers $LD_{LL1}$ to $LD_{LL3}$) fail, the output can be compensated.

Next, the operation of the coupler/distributor 10 having the aforementioned configuration (the operation during driving beam lighting) is described with reference to FIG. 6.

FIG. 6 is a flowchart showing an operation of the coupler/distributor 10.

The following processes are achieved by the CPU 24 executing the predetermined program having been read from the program storage 36b into the RAM.

When the lighting switch 26 is turned on (i.e., driving beam lighting up is instructed), it is determined first whether the semiconductor lasers $LD_{LL1}$, $LD_{LL2}$ and $LD_{LL3}$ is in failure or not (step S10). This is determined according to whether the failure flag E stored in the RAM or the like stores content indicating failure (e.g., "1") or not.

When it is determined that the semiconductor lasers $LD_{LL1}$, $LD_{LL2}$ and $LD_{LL3}$ are not in failure (step S10: No), it is then determined whether the ambient temperature is a low temperature or not (step S12). This is determined according to whether the ambient temperature flag T stored in the RAM or the like stores content indicating a low temperature (e.g., "0") or not. When the output (value) of the ambient environment temperature sensor 30>the predetermined threshold value, the ambient temperature flag T is set to the content indicating that the ambient environment temperature is a high temperature (e.g., "1"). On the contrary, when the output of the ambient environment temperature sensor 30<the predetermined threshold value, this flag is set to the content indicating that the ambient environment temperature is a low temperature (e.g., "0").

When the ambient temperature is determined to be a low temperature (step S12: Yes), the 1LD recurring lighting process (step S14) is executed.

FIG. 7 is a flowchart showing the 1LD recurring lighting process (step S14).

Hereinafter, the case where the semiconductor lasers $LD_{LL1}$, $LD_{LL2}$ and $LD_{LL3}$ light up in order of the first semiconductor laser $LD_{LL1}$ to second semiconductor laser $LD_{LL2}$ to third semiconductor laser $LD_{LL3}$ . . . (repetition thereafter) is described. It is a matter of course the order may be other than this order.

Figure 17:
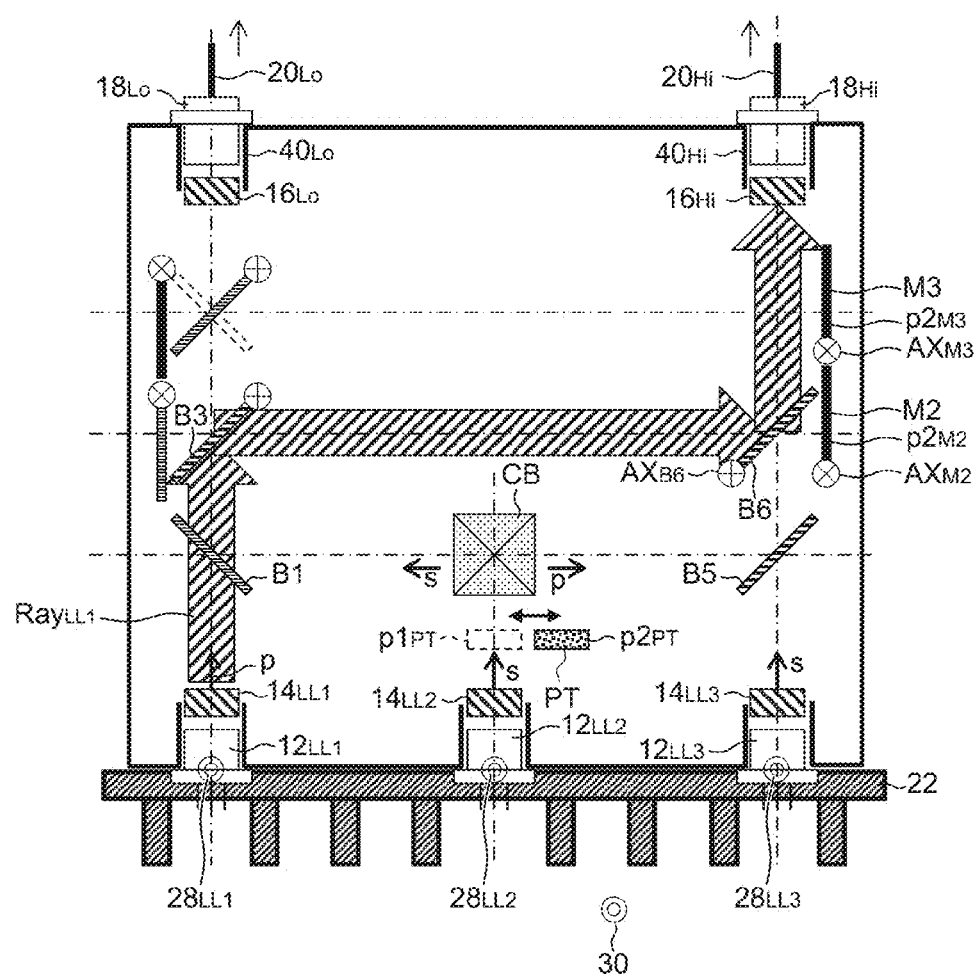
FIG. 17 is a diagram showing the optical path of laser light $Ray_{LL1}$ from the first semiconductor laser $LD_{LL1}$ in the 1LD recurring lighting process (during driving beam lighting).

As shown in FIG. 17, in order to constitute an optical path that guides the laser light $Ray_{LL1}$ from the first semiconductor laser $LD_{LL1}$ to the second optical fiber attachment $40_{Hi}$ (the incident end of the second optical fiber $20_{Hi}$ connected thereto), the third beam splitter B3 and the sixth beam splitter B6 are disposed at the respective inserted positions $p1_{B3}$ and $p1_{B6}$ (the case of having been disposed at retracted positions) (step S1402). All of the other elements are disposed at the respective retracted positions. This is achieved by the actuator control device 24a controlling actuators (not shown) provided in conformity with the third beam splitter B3 and the sixth beam splitter B6.

Next, the laser light source control device 24b controls the LD lighting circuit 34 so that the first semiconductor laser $LD_{LL1}$ can light up at the predetermined first optical output (FULL output) (and the second semiconductor laser $LD_{LL2}$ and the third semiconductor laser $LD_{LL3}$ can be in the idle states) (step S1404).

As shown in FIG. 17, the laser light $Ray_{LL1}$ from the first semiconductor laser $LD_{LL1}$ enters the first beam splitter B1 as p-polarized light and passes the splitter, is reflected by the third beam splitter B3 and the sixth beam splitter B6, and enters the second optical fiber attachment $40_{Hi}$ (the incident end of the second optical fiber $20_{Hi}$ connected thereto). The light propagates to the lamp fitting unit $102_{Hi}$ for the driving beam through the second optical fiber $20_{Hi}$, and is used to form a light distribution pattern for the driving beam.

Figure 18:
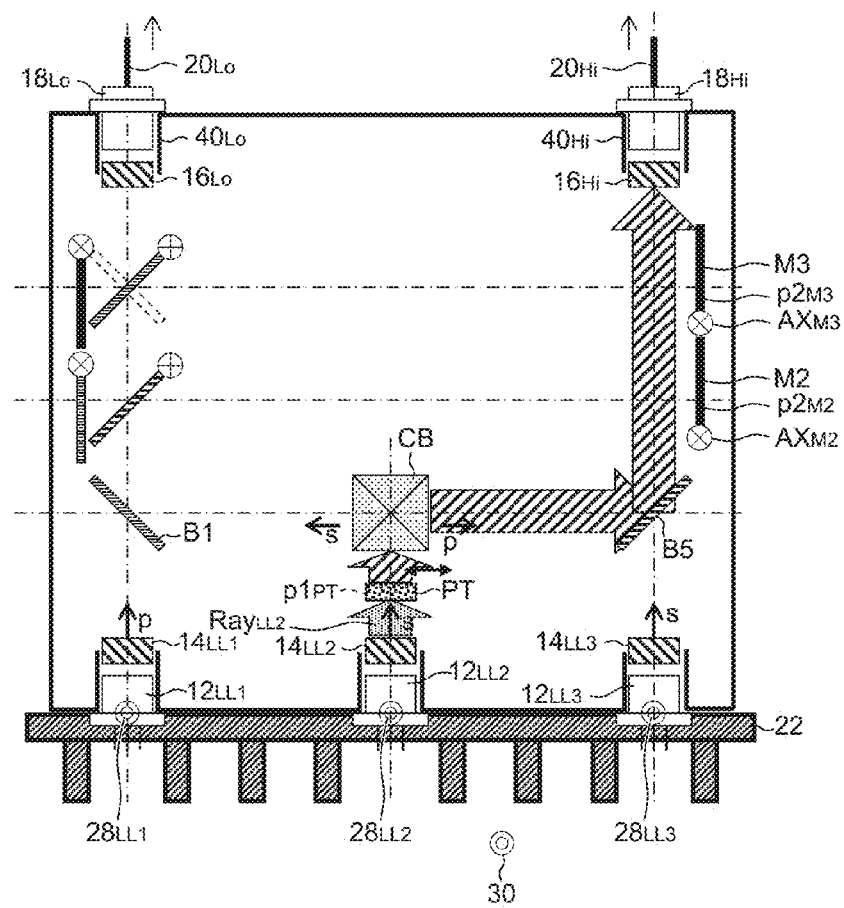
FIG. 18 is a diagram showing the optical path of laser light $Ray_{LL2}$ from the second semiconductor laser $LD_{LL2}$ in the 1LD recurring lighting process (during driving beam lighting).

Next, it is determined whether a predetermined time $T_{LL1}$ has elapsed or not (step S1406). When it is then determined that the predetermined time $T_{LL1}$ has elapsed (step S1406: Yes), as shown in FIG. 18, in order to constitute an optical path that guides the laser light $Ray_{LL2}$ from the second semiconductor laser $LD_{LL2}$ to the second optical fiber attachment $40_{Hi}$ (the incident end of the second optical fiber $20_{Hi}$ connected thereto), the half wavelength plate PT is disposed at the inserted position $p1_{PT}$ (the case of having been disposed at the retracted position) (step S1408). All of the other elements are disposed at the respective retracted positions. This is achieved by the actuator control device 24a controlling an actuator (not shown) provided in conformity with the half wavelength plate PT and the like.

Next, the laser light source control device 24b controls the LD lighting circuit 34 so that the second semiconductor laser $LD_{LL2}$ can light up at the predetermined first optical output (FULL output) (and the first semiconductor laser $LD_{LL1}$ and the third semiconductor laser $LD_{LL3}$ can be in the idle states) (step S1410).

As shown in FIG. 18, the laser light $Ray_{LL2}$ from the second semiconductor laser $LD_{LL2}$ enters the half wavelength plate PT as s-polarized light and is emitted from the half wavelength plate PT as p-polarized light, enters the cross beam splitter CB as p-polarized light, is reflected by this cross beam splitter CB toward the fifth beam splitter B5, and is further reflected by the fifth beam splitter B5, is condensed by the condenser lens $16_{Hi}$ and enters the second optical fiber attachment $40_{Hi}$ (the incident end of the second optical fiber $20_{Hi}$ connected thereto). The light propagates to the lamp fitting unit $102_{Hi}$ for the driving beam through the second optical fiber $20_{Hi}$, and is used to form a light distribution pattern for the driving beam.

Figure 19:
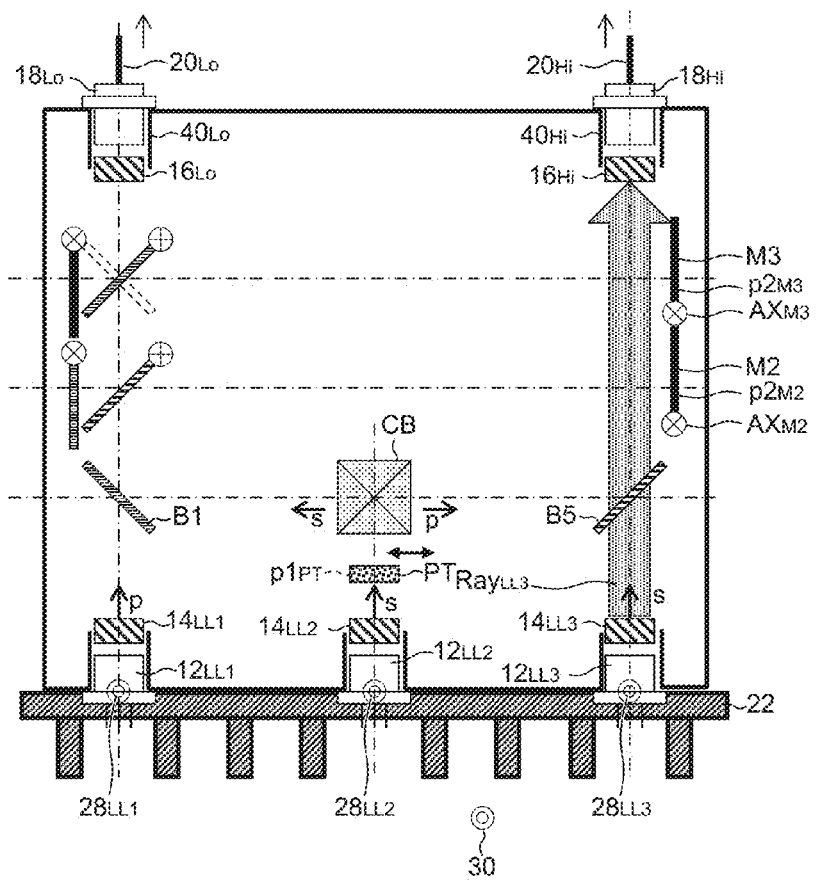
FIG. 19 is a diagram showing the optical path of laser light $Ray_{LL3}$ from the third semiconductor laser $LD_{LL3}$ in the 1LD recurring lighting process (during driving beam lighting).

Next, it is determined whether a predetermined time $T_{LL2}$ has elapsed or not (step S1412). When it is then determined that the predetermined time $T_{LL2}$ has elapsed (step S1412: Yes), as shown in FIG. 19, in order to constitute an optical path that guides the laser light $Ray_{LL3}$ from the third semiconductor laser $LD_{LL3}$ to the second optical fiber attachment $40_{Hi}$ (the incident end of the second optical fiber $20_{Hi}$ connected thereto), the second mirror M2 and the third mirror M3 are disposed at the respective retracted positions $p2_{M2}$ and $p2_{M3}$ (the case of having been disposed at inserted positions) (step S1414). This is achieved by the actuator control device 24a controlling actuators (not shown) provided in conformity with the second mirror M2 and the third mirror M3.

Next, the laser light source control device 24b controls the LD lighting circuit 34 so that the third semiconductor laser $LD_{LL3}$ can light up at the predetermined first optical output (FULL output) (and the first semiconductor laser $LD_{LL1}$ and the second semiconductor laser $LD_{LL2}$ can be in the idle states) (step S1416).

As shown in FIG. 19, the laser light $Ray_{LL3}$ from the third semiconductor laser $LD_{LL3}$ enters the fifth beam splitter B5 as s-polarized light and passes this splitter, is condensed by the condenser lens $16_{Hi}$ and enters the second optical fiber attachment $40_{Hi}$ (the incident end of the second optical fiber $20_{Hi}$ connected thereto). The light propagates to the lamp fitting unit $102_{Hi}$ for the driving beam through the second optical fiber $20_{Hi}$, and is used to form a light distribution pattern for the driving beam.

Next, it is determined whether a predetermined time $T_{LL3}$ has elapsed or not (step S1418). When it is then determined that the predetermined time $T_{LL3}$ has elapsed (step S1418: Yes), the processing proceeds to step S20.

The 1LD recurring lighting process (step S14) is repeated until it is determined that the lighting switch 26 is not on (step S20: No).

The lighting times $T_{LL1}$ to $T_{LL3}$ of the semiconductor lasers $LD_{LL1}$ to $LD_{LL3}$ may be even or uneven.

As described above, the semiconductor lasers $LD_{LL1}$, $LD_{LL2}$ and $LD_{LL3}$ are controlled so as to light up one by one in predetermined order at the predetermined second optical output (HALF output) every lapse of the predetermined time, thereby allowing the heat generation source to be distributed (output distribution) on the radiator plate 22. Consequently, an advantageous effect analogous to that in the case of including a heat spreader can be obtained, and the heat radiation efficiency is improved. That is, the lives of the semiconductor lasers $LD_{LL1}$ to $LD_{LL3}$ can be improved and failure can be prevented. In the 1LD recurring lighting process (step S14), the operation time of the semiconductor lasers $LD_{LL1}$ to $LD_{LL3}$ can be divided equally among three. Consequently, the lives of the semiconductor lasers $LD_{LL1}$ to $LD_{LL3}$ can be increased about three times.

As described above, while the semiconductor lasers $LD_{LL1}$, $LD_{LL2}$ and $LD_{LL3}$ are controlled so as to light up one by one in predetermined order at the predetermined first optical output (FULL output) every lapse of a predetermined time (steps S1402 to S1418), the failed LD recording device 24c executes the failed LD recording process shown in FIG. 11 in parallel. The failed LD recording process has already been described. Consequently, the description thereof is omitted. Furthermore, the lighting process during failure (step S18) has already been described. Consequently, the description thereof is also omitted.

On the other hand, when the ambient temperature is determined to be a high temperature (step S12: No), the 2LD recurring lighting process (step S16) is executed.

FIG. 12 is a flowchart showing the 2LD recurring lighting process (step S16).

Hereinafter, the case where the semiconductor lasers $LD_{LL1}$, $LD_{LL2}$ and $LD_{LL3}$ light up in order of the semiconductor lasers $LD_{LL1}$ and $LD_{LL2}$ to semiconductor lasers $LD_{LL2}$ and $LD_{LL3}$ to semiconductor lasers $LD_{LL1}$ and $LD_{LL3}$ . . . (repetition thereafter) is described. It is a matter of course that the order may be other than this order.

Figure 20:
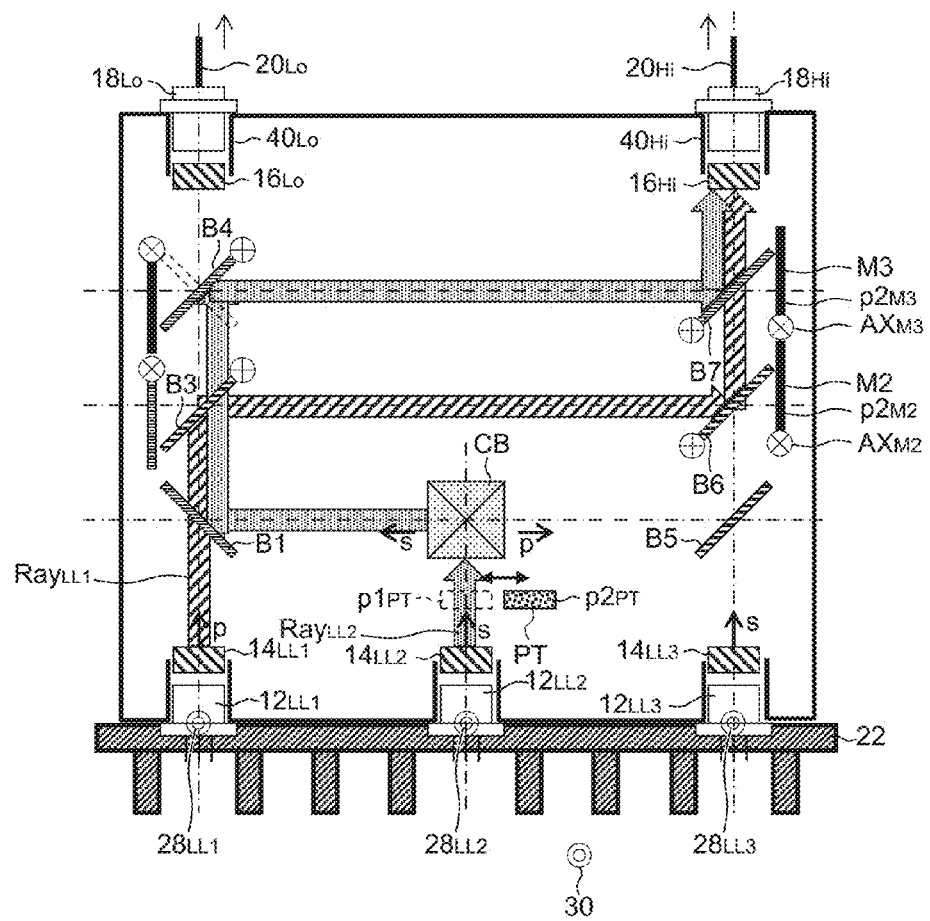
FIG. 20 is a diagram showing the optical paths of laser light $Ray_{LL1}$ and $Ray_{LL2}$ from the semiconductor lasers $LD_{LL1}$ and $LD_{LL2}$ in the 2LD recurring lighting process (during driving beam lighting).

First, as shown in FIG. 20, in order to constitute optical paths that guide the laser light $Ray_{LL1}$ and $Ray_{LL2}$ from the first semiconductor laser $LD_{LL1}$ and the second semiconductor laser $LD_{LL2}$ to the second optical fiber attachment $40_{Hi}$ (the incident end of the second optical fiber $20_{Hi}$ connected thereto), the third beam splitter B3, the fourth beam splitter B4, the sixth beam splitter B6 and the seventh beam splitter B7 are disposed at the respective inserted positions $p1_{B2}$, $p1_{B4}$, $p1_{B6}$ and $p1_{B7}$ (the case of having been disposed at retracted positions) (step S1602). This is achieved by the actuator control device 24a controlling actuators (not shown) provided in conformity with the third beam splitter B3, the fourth beam splitter B4, the sixth beam splitter B6 and the seventh beam splitter B7.

Next, the laser light source control device 24b controls the LD lighting circuit 34 so that the first semiconductor laser $LD_{LL1}$ and the second semiconductor laser $LD_{LL2}$ can light up at a predetermined second optical output (HALF output that is half a FULL output) (and the third semiconductor laser $LD_{LL3}$ can be in the idle state) (step S1604).

As shown in FIG. 20, the laser light $Ray_{LL1}$ from the first semiconductor laser $LD_{LL1}$ enters the first beam splitter B1 as p-polarized light and passes the splitter, is reflected by the third beam splitter B3 and the sixth beam splitter B6, then passes through the seventh beam splitter B7, is condensed by the condenser lens $16_{Hi}$, and enters the second optical fiber attachment $40_{Hi}$ (the incident end of the second optical fiber $20_{Hi}$ connected thereto). Meanwhile, the laser light $Ray_{LL2}$ from the second semiconductor laser $LD_{LL2}$ enters the cross beam splitter CB as s-polarized light and is reflected by this cross beam splitter CB toward the first beam splitter B1, is reflected by the first beam splitter B1, passes through the third beam splitter B3, is reflected by the fourth beam splitter B4 and the seventh beam splitter B7, is condensed by the condenser lens $16_{Hi}$ and enters the second optical fiber attachment $40_{Hi}$ (the incident end of the second optical fiber $20_{Hi}$ connected thereto). The laser light propagates to the lamp fitting unit $102_{Hi}$ for the driving beam through the second optical fiber $20_{Hi}$, and is used to form a light distribution pattern for the driving beam.

Figure 21:
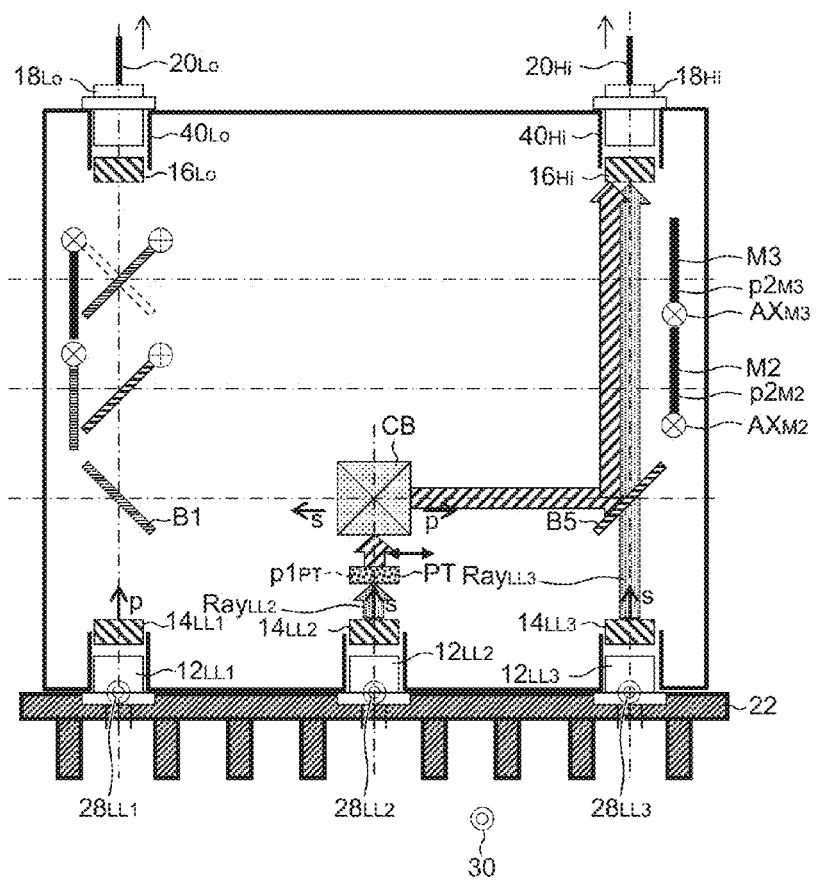
FIG. 21 is a diagram showing the optical paths of laser light $Ray_{LL2}$ and $Ray_{LL3}$ from the semiconductor lasers $LD_{LL2}$ and $LD_{LL3}$ in the 2LD recurring lighting process (during driving beam lighting).

Next, it is determined whether the predetermined time $T_{LL1\text{-}LL2}$ has elapsed or not (step S1606). When it is determined that the predetermined time $T_{LL1\text{-}LL2}$ has elapsed (step S1606: Yes), as shown in FIG. 21, in order to constitute optical paths that guide the laser light $Ray_{LL2}$ and the laser light $Ray_{LL3}$ from the second semiconductor laser $LD_{LL2}$ and the third semiconductor laser $LD_{LL3}$ to the second optical fiber attachment $40_{Hi}$ (the incident end of the second optical fiber $20_{Hi}$ connected thereto), the half wavelength plate PT is disposed at the inserted position $p1_{PT}$ (the case of having been disposed at the retracted position) (step S1608). All of the other elements are disposed at the respective retracted positions. This is achieved by the actuator control device 24a controlling an actuator (not shown) provided in conformity with the half wavelength plate PT and the like.

Next, the laser light source control device 24b controls the LD lighting circuit 34 so that the second semiconductor laser $LD_{LL2}$ and the third semiconductor laser $LD_{LL3}$ can light up at the predetermined second optical output (HALF output that is half a FULL output) (and the first semiconductor laser $LD_{LL1}$ can be in the idle state) (step S1610).

As shown in FIG. 21, the laser light $Ray_{LL2}$ from the second semiconductor laser $LD_{LL2}$ enters the half wavelength plate PT as s-polarized light and is emitted from the half wavelength plate PT as p-polarized light, enters the cross beam splitter CB as p-polarized light, is reflected by this cross beam splitter CB toward the fifth beam splitter B5, and is reflected by the fifth beam splitter B5, is condensed by the condenser lens $16_{Hi}$ and enters the second optical fiber attachment $40_{Hi}$ (the incident end of the second optical fiber $20_{Hi}$ connected thereto). Meanwhile, the laser light $Ray_{LL3}$ from the third semiconductor laser $LD_{LL3}$ enters the fifth beam splitter B5 as s-polarized light and passes this splitter, is condensed by the condenser lens $16_{Hi}$ and enters the second optical fiber attachment $40_{Hi}$ (the incident end of the second optical fiber $20_{Hi}$ connected thereto). The laser light propagates to the lamp fitting unit $102_{Hi}$ for the driving beam through the second optical fiber $20_{Hi}$, and is used to form a light distribution pattern for the driving beam.

Figure 22:
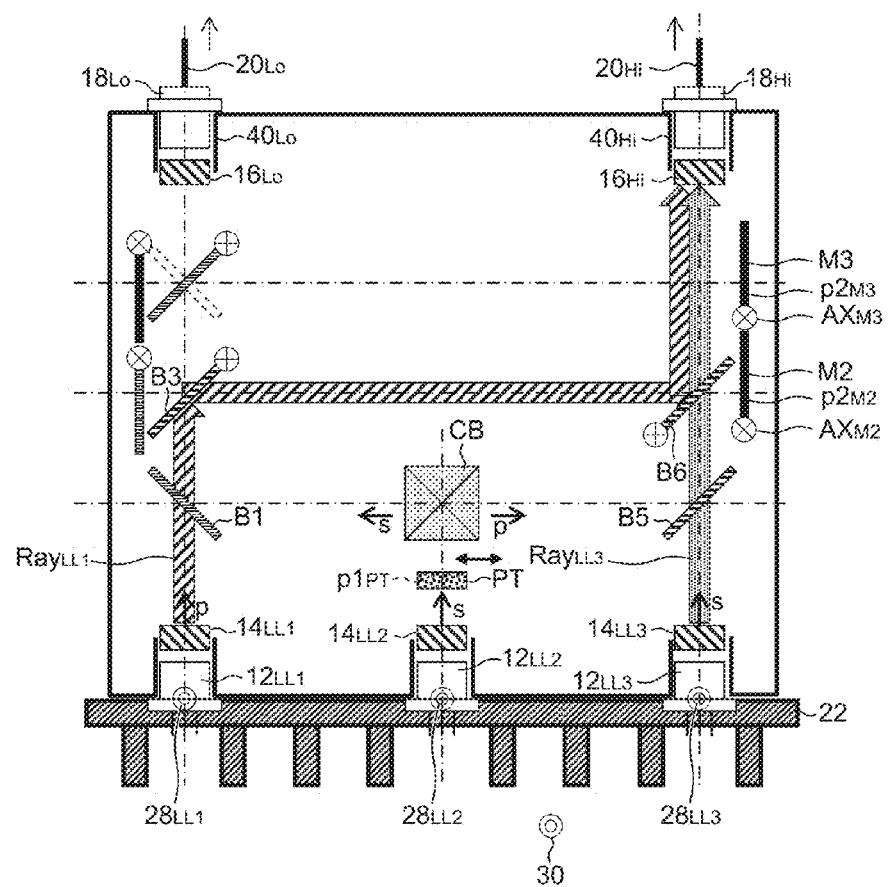
FIG. 22 is a diagram showing the optical paths of laser light $Ray_{LL1}$ and $Ray_{LL3}$ from the semiconductor lasers $LD_{LL1}$ and $LD_{LL3}$ in the 2LD recurring lighting process (during driving beam lighting).
Figure 23:
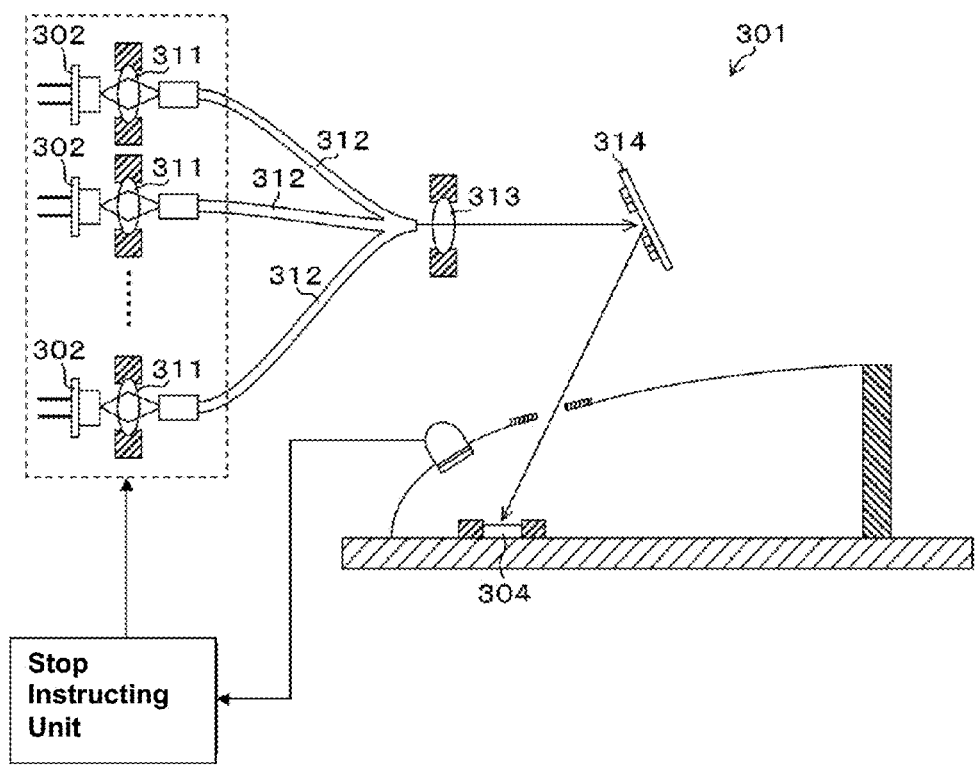
FIG. 23 is a schematic configuration diagram of a lamp fitting 1 for a vehicle described in PTL 1.

Next, it is determined whether the predetermined time $T_{LL2-LL3}$ has elapsed or not (step S1612). When it is then determined that the predetermined time $T_{LL2-LL3}$ has elapsed (step S1612: Yes), as shown in FIG. 22, in order to constitute optical paths that guide the laser light $Ray_{LL1}$ and $Ray_{LL3}$ from the first semiconductor laser $LD_{LL1}$ and the third semiconductor laser $LD_{LL3}$ to the second optical fiber attachment $40_{Hi}$ (the incident end of the second optical fiber $20_{Hi}$ connected thereto), the third beam splitter B3 and the sixth beam splitter B6 are disposed at the respective inserted positions $p1_{B3}$ and $p1_{B6}$ (the case of having been disposed at retracted positions) (step S1614). All of the other elements are disposed at the respective retracted positions. This is achieved by the actuator control device 24a controlling actuators (not shown) provided in conformity with the third beam splitter B3 and the sixth beam splitter B6.

Next, the laser light source control device 24b controls the LD lighting circuit 34 so that the first semiconductor laser $LD_{LL1}$ and the third semiconductor laser $LD_{LL3}$ can light up at the predetermined second optical output (HALF output that is half a FULL output) (and the second semiconductor laser $LD_{LL2}$ can be in the idle state) (step S1616).

As shown in FIG. 22, the laser light $Ray_{LL1}$ from the first semiconductor laser $LD_{LL1}$ enters the first beam splitter B1 as p-polarized light and passes the splitter, is reflected by the third beam splitter B3 and the sixth beam splitter B6, is condensed by the condenser lens $16_{Hi}$, and enters the second optical fiber attachment $40_{Hi}$ (the incident end of the second optical fiber $20_{Hi}$ connected thereto). Meanwhile, the laser light $Ray_{LL3}$ from the third semiconductor laser $LD_{LL3}$ enters the fifth beam splitter B5 and the sixth beam splitter B6 as s-polarized light and passes these splitters, is condensed by the condenser lens $16_{Hi}$ and enters the second optical fiber attachment $40_{Hi}$ (the incident end of the second optical fiber $20_{Hi}$ connected thereto). The laser light propagates to the lamp fitting unit $102_{Hi}$ for the driving beam through the second optical fiber $20_{Hi}$, and is used to form a light distribution pattern for the driving beam.

Next, it is determined whether the predetermined time $T_{LL1-LL3}$ has elapsed or not (step S1618). When it is determined that the predetermined time $T_{LL1-LL3}$ has elapsed (step S1618: Yes), the processing proceeds to step S20.

The 2LD recurring lighting process (step S16) is repeated until it is determined that the lighting switch 26 is not on (step S20: No).

The lighting times $T_{LL1-LL2}$ to $T_{LL1-LL3}$ of the semiconductor lasers $LD_{LL1}$ to $LD_{LL3}$ may be even or uneven.

As described above, the semiconductor lasers $LD_{LL1}$, $LD_{LL2}$ and $LD_{LL3}$ are controlled so as to light up two by two in predetermined order at the predetermined second optical output (HALF output that is half a FULL output) every lapse of the predetermined time. Consequently, the output loads on the semiconductor lasers $LD_{LL1}$ to $LD_{LL3}$ can be reduced while the heat generation source can be distributed (output distribution) on the radiator plate 22 at the same time. Thus, an advantageous effect analogous to that in the case of including a heat spreader can be obtained, and the heat radiation efficiency can be improved. The thermal resistance of the heat radiation system is constant over the entire system. Consequently, reduction in output can halve the increase in temperature ΔTj at a junction section. That is, the lives of the semiconductor lasers $LD_{LL1}$ to $LD_{LL3}$ can be improved and failure can be prevented. In the 2LD recurring lighting process (step S16), the operation time of the semiconductor lasers $LD_{LL1}$ to $LD_{LL3}$ can be divided equally among three, and the output loads on the semiconductor lasers $LD_{LL1}$ to $LD_{LL3}$ can be halved. Consequently, the lives of the semiconductor lasers $LD_{LL1}$ to $LD_{LL3}$ can be increased about three times.

As described above, when the temperature of the ambient environment is lower than the predetermined threshold value, the laser light source control device 24b controls the laser light sources (semiconductor lasers $LD_{LL1}$ to $LD_{LL3}$) to light up in predetermined order at the first optical output (FULL output) every lapse of a predetermined time. On the contrary, when the temperature of the ambient environment is higher than the predetermined threshold value, the device controls the laser light sources (semiconductor lasers $LD_{LL1}$ to $LD_{LL3}$) to light up in predetermined order at the second optical output (HALF output) lower than the first optical output every lapse of the predetermined time.

Thus, in the lamp fitting for a vehicle including the plurality of laser light sources (semiconductor lasers $LD_{LL1}$ to $LD_{LL3}$) (e.g., the lamp fitting unit $102_{Lo}$ for the passing beam and the lamp fitting unit $102_{Hi}$ for the driving beam), the heat radiation characteristics of the plurality of laser light sources (semiconductor lasers $LD_{LL1}$ to $LD_{LL3}$) can be further improved (as a result, the lives of the laser light sources (semiconductor lasers $LD_{LL1}$ to $LD_{LL3}$) can be further improved, and failure in the laser light sources (semiconductor lasers $LD_{LL1}$ to $LD_{LL3}$) can be further prevented from occurring).

This is because the plurality of laser light sources (semiconductor lasers $LD_{LL1}$ to $LD_{LL3}$) are controlled so that the sources do not light up simultaneously and continuously as in the conventional art, but in the case where the temperature of the ambient environment is low (the temperature of the ambient environment<the predetermined threshold value) and in the case where the temperature of the ambient environment is high (the temperature of the ambient environment>the predetermined threshold value), the sources light up according to each of the cases (i.e., the output is distributed).

As described above, while the semiconductor lasers $LD_{LL1}$, $LD_{LL2}$ and $LD_{LL3}$ are controlled so as to light up two by two in predetermined order at the predetermined second optical output (HALF output) every lapse of a predetermined time (steps S1602 to S1618), the failed LD recording device 24c executes the failed LD recording process shown in FIG. 11 in parallel. The failed LD recording process has already been described. Consequently, the description thereof is omitted. Furthermore, the lighting process during failure (step S18) has already been described. Consequently, the description thereof is also omitted.

As described above, according to this embodiment, in the lamp fitting 100 for a vehicle that includes the plurality of laser light sources (semiconductor lasers $LD_{LL1}$, $LD_{LL2}$ and $LD_{LL3}$), the laser light from the plurality of laser light sources (semiconductor lasers $LD_{LL1}$, $LD_{LL2}$ and $LD_{LL3}$) can be guided to the plurality of optical systems (e.g., the lamp fitting unit $102_{Lo}$ for the passing beam and the lamp fitting unit $102_{Hi}$ for the driving beam), and used in the plurality of optical systems.

This is because the plurality of optical elements constituting the optical path that guides the laser light from at least one of the plurality of laser light sources (semiconductor lasers $LD_{LL1}$, $LD_{LL2}$ and $LD_{LL3}$) to the incident end(s) of one or more optical fibers $20_{Lo}$ and $20_{Hi}$, that is, the beam splitters B1 to B7, the mirrors M1 to M3, the cross beam splitter CB, the half wavelength plate PT, etc., are disposed between the plurality of laser light sources (semiconductor lasers $LD_{LL1}$, $LD_{LL2}$ and $LD_{LL3}$) and the incident end(s) of the one or more optical fibers $20_{Lo}$ and $20_{Hi}$.

This embodiment can guide the laser light from the plurality of the laser light sources (semiconductor lasers $LD_{LL1}$, $LD_{LL2}$ and $LD_{LL3}$) to the plurality of optical systems (e.g., the lamp fitting unit $102_{Lo}$ for the passing beam and the lamp fitting unit $102_{Hi}$ for the driving beam). Consequently, no difference occurs between the lives of the laser light sources due to frequency in use for each optical system, and the lives of the laser light sources can be increased.

Every numerical value described in each of the embodiments and variation examples is only an example. An appropriate numerical value different therefrom may be used.

The embodiments are only examples in all aspects. The present invention is not construed in a limited manner owing to the description. The present invention can be implemented in various other forms without departing from the spirit and main characteristics thereof.

REFERENCE SIGNS LIST

10 . . . Coupler/distributor, $12_{LL1}$-$12_{LL3}$ . . . Laser light sources, $14_{LL1}$-$14_{LL3}$ . . . Collimating lenses, $16_{Lo}$ and $16_{Hi}$ . . . Condenser lenses, $20_{Lo}$ and $20_{Hi}$ . . . Optical fibers, 22 . . . Radiator plate, 24a . . . Actuator control device, 24b . . . Laser light source control device, 24c . . . Failed LD recording device, 26 . . . Lighting switch, $28_{LL1}$-$28_{LL1}$ . . . Temperature sensors, 30 . . . Ambient environment temperature sensor, 32 . . . Actuator drive circuit, 34 . . . Lighting circuit, 36a . . . Alarm detection history recorder, 36b . . . Program storage, $40_{Lo}$ and $40_{Hi}$ . . . Optical fiber attachments, 100 . . . Lamp fitting for a vehicle, $102_{Lo}$ and $102_{Hi}$ . . . Lamp fitting units, 104 . . . Light source module, 106 . . . Optical fiber attachment, 108 . . . Mirror, 110 . . . Wavelength converting member, 112 . . . Projecting lens, 114 . . . Condenser lens, 116 . . . Cooling fins, 118 . . . Extension, 120 . . . Outer lens, 122 . . . Housing, 124 . . . Lamp chamber, 128 . . . Power source, 130 . . . Casing, $A_{LL1}$-$A_{LL3}$ . . . Junction planes, B1-B7 . . . Beam splitters, CB . . . cross beam splitter, $LD_{LL1}$-$LD_{LL3}$ . . . Semiconductor lasers, M1-M3 . . . Mirrors, $PD_{LL1}$-$PD_{LL3}$ . . . Photodiodes, PT . . . Half wavelength plate.

ENGLISH TRANSLATION OF DRAWINGS

FIG. 5
32 ACTUATOR DRIVE CIRCUIT
B2 BEAM SPLITTER
B3 BEAM SPLITTER
B4 BEAM SPLITTER
B6 BEAM SPLITTER
B7 BEAM SPLITTER
M1 MIRROR
M2 MIRROR
M3 MIRROR
PT HALF WAVELENGTH PLATE
34 LD LIGHTING CIRCUIT
LL1 SEMICONDUCTOR LASER
LL2 SEMICONDUCTOR LASER
LL3 SEMICONDUCTOR LASER
24a ACTUATOR CONTROL DEVICE
24b LASER LIGHT SOURCE CONTROL DEVICE
24c FAILED LD RECORDING DEVICE
1 STORAGE
36a ALARM DETECTION HISTORY RECORDER
36b PROGRAM STORAGE
E FAILURE FLAG
T AMBIENT TEMPERATURE FLAG
26 LIGHTING SWITCH
$PD_{LL1}$ PHOTODIODE
$PD_{LL2}$ PHOTODIODE
$PD_{LL3}$ PHOTODIODE
$28_{LL1}$ TEMPERATURE SENSOR
$28_{LL2}$ TEMPERATURE SENSOR
$28_{LL3}$ TEMPERATURE SENSOR
30 AMBIENT ENVIRONMENT TEMPERATURE SENSOR
FIG. 6
1 LIGHTING SWITCH ON
S10 LD FAILURE?
2 "FAILURE"
3 "NORMALITY"
S12 IS AMBIENT TEMPERATURE LOW TEMPERATURE?
4 "HIGH TEMPERATURE"
5 "LOW TEMPERATURE"
S14 1LD RECURRING LIGHTING PROCESS
S16 2LD RECURRING LIGHTING PROCESS
S18 LIGHTING PROCESS DURING FAILURE
S20 IS LIGHTING SWITCH ON?
6 END
FIG. 7
S14 1LD RECURRING LIGHTING PROCESS
S1402 DISPOSE EACH MIRROR ETC. FOR LL1
S1404 TURN ON LL1 (TURN OFF WHAT IS OTHER THAN LL1)
S1406 HAS TIME $T_{LL1}$ ELAPSED?
S1408 DISPOSE EACH MIRROR ETC. FOR LL2
S1410 TURN ON LL2 (TURN OFF WHAT IS OTHER THAN LL2)
S1412 HAS TIME $T_{LL2}$ ELAPSED?
S1414 DISPOSE EACH MIRROR ETC. FOR LL3
S1416 TURN ON LL3 (TURN OFF WHAT IS OTHER THAN LL3)
S1418 HAS TIME $T_{LL3}$ ELAPSED?
1 RETURN

FIG. 11
1 FAILED LD RECORDING PROCESS
S30 DETECT OUTPUT OF PHOTODIODES
S32 PERFORM COMPARISON WITH FIRST THRESHOLD VALUE OR SECOND THRESHOLD VALUE
S34 WRITE LD LIGHTING STATES IN ALARM DETECTION HISTORY RECORDER
S36 FAILURE?
S38 SET FAILURE FLAG (E=1)
S40 IS LIGHTING SWITCH ON?
2 END

FIG. 12
S16 2LD RECURRING LIGHTING PROCESS
S1602 DISPOSE EACH MIRROR ETC. FOR LL1 AND LL2
S1604 TURN ON LL1 AND LL2 (TURN OFF LL3)
S1606 HAS TIME $T_{LL1\text{-}LL2}$ ELAPSED?
S1608 DISPOSE EACH MIRROR ETC. FOR LL2 AND LL3
S1610 TURN ON LL2 AND LL3 (TURN OFF LL1)
S1612 HAS TIME $T_{LL2\text{-}LL3}$ ELAPSED?
S1614 DISPOSE EACH MIRROR ETC. FOR LL1 AND LL3
S1616 TURN ON LL1 AND LL3 (TURN OFF LL2)
S1618 HAS TIME $T_{LL1\text{-}LL3}$ ELAPSED?
1 RETURN FIG. 16
S18 LIGHTING PROCESS DURING FAILURE
S1802 THE NUMBER OF FAILURES?
1 THE NUMBER OF FAILURES=1
2 THE NUMBER OF FAILURES=2
3 THE NUMBER OF FAILURES=3
S1804 DISPOSE EACH MIRROR ETC. FOR (TWO) LDS WITHOUT FAILURE
S1806 LIGHT UP (TWO) LDS WITHOUT FAILURE
S1808 DISPOSE EACH MIRROR ETC. FOR (ONE) LD WITHOUT FAILURE
S1810 LIGHT UP (ONE) LD WITHOUT FAILURE
4 RETURN

FIG. 23
1 STOP INSTRUCTING UNIT

The invention claimed is:

1. A lamp fitting for a vehicle, comprising:
a plurality of laser light sources;
a plurality of optical fibers;
one or more optical systems which are provided in conformity with the optical fibers and to which a corresponding emission end of each of the optical fibers is connected;
a plurality of optical elements which include mirror type elements disposed between the plurality of laser light sources and an incident end of the optical fibers, and constitute an optical path configured to guide laser light from at least one of the plurality of laser light sources to the incident end of at least one of the optical fibers;
at least one actuator connected to at least one of the mirror type elements such that the at least one of the mirror type elements is actuatable into an actuated state in which the at least one of the mirror type elements causes a direction of the optical path to change and into a non-actuated state in which the at least one of the mirror type elements does not cause a direction of the optical path to change; and
a laser light source control device configured to control the plurality of laser light sources so as to light up in predetermined order at a predetermined optical output every lapse of a predetermined time; wherein
when a temperature of an ambient environment is lower than a predetermined threshold value, the laser light source control device controls the plurality of laser light sources so as to light up in predetermined order at a first optical output every lapse of a predetermined time, and
when the temperature of the ambient environment is higher than the predetermined threshold value, the laser light source control device controls the plurality of laser light sources so as to light up in predetermined order at a second optical output lower than the first optical output every lapse of the predetermined time.

2. The lamp fitting for a vehicle according to claim 1, wherein the optical elements include at least one of a beam splitter, a mirror, a cross beam splitter, and a half wavelength plate.

3. The lamp fitting for a vehicle according to claim 1, wherein the actuator is configured to change a position of at least one optical element among the plurality of optical elements so as to constitute an optical path that guides laser light from the lighting-up laser light source among the plurality of laser light sources to the incident end of the one or more optical fibers.

4. The lamp fitting for a vehicle according to claim 1, wherein when at least one laser light source among the plurality of laser light sources fails, a laser light source other than the failed laser light source among the plurality of laser light sources is used.

5. The lamp fitting for a vehicle according to claim 3, wherein when at least one laser light source among the plurality of laser light sources fails, a laser light source other than the failed laser light source among the plurality of laser light sources is used.

6. The lamp fitting for a vehicle according to claim 1, wherein the light-emitting wavelengths of the plurality of laser light sources are in the blue range or the near-ultraviolet range.

7. The lamp fitting for a vehicle according to claim 2, wherein the light-emitting wavelengths of the plurality of laser light sources are in the blue range or the near-ultraviolet range.

8. The lamp fitting for a vehicle according to claim 3, wherein the light-emitting wavelengths of the plurality of laser light sources are in the blue range or the near-ultraviolet range.

9. The lamp fitting for a vehicle according to claim 4, wherein the light-emitting wavelengths of the plurality of laser light sources are in the blue range or the near-ultraviolet range.

10. The lamp fitting for a vehicle according to claim 5, wherein the light-emitting wavelengths of the plurality of laser light sources are in the blue range or the near-ultraviolet range.

11. A coupler/distributor, comprising:
a plurality of laser light sources;
one or more optical fiber attachments;
a plurality of optical elements which are disposed between the plurality of laser light sources and one or more optical fiber attachments, a first plurality of optical elements constituting a first optical path from at least one of the plurality of laser light sources to the one or more optical fiber attachments, the first plurality of optical elements configured to guide laser light along the first optical path extending from the at least one of the plurality of laser light sources to an incident end of one or more optical fibers connected to the one or more optical fiber attachments, and a second plurality of optical elements constituting a second optical path different from the first optical path, the second plurality of optical elements configured to guide laser light along the second optical path from the at least one of the plurality of laser light sources to the incident end of one or more optical fibers connected to the one or more optical fiber attachments, wherein the first optical path diverts away from the second optical path at least once along an extent of the first optical path; and a laser light source control device configure to control the plurality of laser light sources so as to light up in predetermined order at a predetermined optical output every lapse of a predetermined time, wherein when a temperature of an ambient environment is lower than a predetermined threshold value, the laser light source control device controls the plurality of laser light sources so as to light up in predetermined order at a first optical output every lapse of a predetermined time, and when the temperature of the ambient environment is higher than the predetermined threshold value, the laser light source control device controls the plurality of laser light sources so as to light up in predetermined order at a second optical output lower than the first optical output every lapse of the predetermined time.

12. The coupler/distributor according to claim 11, wherein the optical elements include at least one of a beam splitter, a mirror, a cross beam splitter, and a half wavelength plate.

13. The coupler/distributor according to claim 11, further comprising an actuator that changes a position of at least one optical element among the plurality of optical elements so as to change light direction from the first optical path to the second optical path.

14. The coupler/distributor according to claim 11, wherein when at least one laser light source among the plurality of laser light sources fails, a laser light source other than the failed laser light source among the plurality of laser light sources is used.

15. The coupler/distributor according to claim 13, wherein when at least one laser light source among the plurality of laser light sources fails, a laser light source other than the failed laser light source among the plurality of laser light sources is used.

16. The coupler/distributor according to claim 11, wherein the light-emitting wavelengths of the plurality of laser light sources are in the blue range or the near-ultraviolet range.

17. The coupler/distributor according to claim 12, wherein the light-emitting wavelengths of the plurality of laser light sources are in the blue range or the near-ultraviolet range.

18. The coupler/distributor according to claim 13, wherein the light-emitting wavelengths of the plurality of laser light sources are in the blue range or the near-ultraviolet range.

19. The coupler/distributor according to claim 14, wherein the light-emitting wavelengths of the plurality of laser light sources are in the blue range or the near-ultraviolet range.

20. The coupler/distributor according to claim 15, wherein the light-emitting wavelengths of the plurality of laser light sources are in the blue range or the near-ultraviolet range.

* * * * *